United States Patent [19]
Kurtz

[11] Patent Number: 6,111,870
[45] Date of Patent: Aug. 29, 2000

[54] METHOD AND APPARATUS FOR COMPRESSING AND TRANSMITTING HIGH SPEED DATA

[75] Inventor: Scott David Kurtz, Mount Laurel, N.J.

[73] Assignee: InterDigital Technology Corporation, Wilmington, Del.

[21] Appl. No.: 08/743,749

[22] Filed: Nov. 7, 1996

[51] Int. Cl.⁷ .............................. H04B 7/212; H04J 3/16; H04J 4/00; H04J 3/12
[52] U.S. Cl. .......................... 370/344; 370/337; 370/468; 370/526; 358/434; 379/93.09; 455/452; 455/509
[58] Field of Search ..................................... 370/345, 341, 370/347, 329, 348, 442, 465, 337, 468, 485–487, 490, 493, 496, 522, 525, 526, 527, 528, 498, 529, 353, 477, 478; 358/442, 434, 435, 438, 439; 379/93.26, 93.08, 93.09; 455/557, 450, 509, 452

[56] References Cited

U.S. PATENT DOCUMENTS

| | | | |
|---|---|---|---|
| 3,700,820 | 10/1972 | Blasbalg et al. | 179/15 BV |
| 3,761,610 | 9/1973 | Krallinger et al. | 178/6 |
| 3,796,835 | 3/1974 | Closs et al. | 370/426 |
| 4,069,392 | 1/1978 | Goldenberg et al. | 178/58 R |
| 4,288,870 | 9/1981 | McDonald et al. | 370/362 |
| 4,330,857 | 5/1982 | Alvarez, III et al. | 370/321 |
| 4,384,307 | 5/1983 | Kuzmik et al. | 358/257 |
| 4,385,206 | 5/1983 | Bradshaw et al. | 370/384 |
| 4,550,425 | 10/1985 | Andersen et al. | 704/212 |
| 4,583,124 | 4/1986 | Tsuji et al. | 358/256 |
| 4,630,126 | 12/1986 | Kaku et al. | 358/280 |
| 4,660,196 | 4/1987 | Gray et al. | 370/326 |
| 4,675,863 | 6/1987 | Paneth et al. | 370/341 |
| 4,823,342 | 4/1989 | Morita et al. | 370/521 |
| 4,870,685 | 9/1989 | Kadokawa et al. | 704/212 |
| 4,974,099 | 11/1990 | Lin et al. | 358/426 |
| 4,980,886 | 12/1990 | Bernstein | 370/433 |
| 5,050,004 | 9/1991 | Morton, Jr. | 358/405 |
| 5,105,423 | 4/1992 | Tanaka et al. | 371/5.5 |
| 5,115,429 | 5/1992 | Hluckyj et al. | 370/232 |
| 5,117,423 | 5/1992 | Shepherd et al. | 370/347 |
| 5,150,401 | 9/1992 | Ashby, III et al. | 380/29 |
| 5,164,938 | 11/1992 | Jurkevich et al. | 370/231 |
| 5,197,125 | 3/1993 | Engel et al. | 370/458 |
| 5,199,061 | 3/1993 | Kim | 379/53 |
| 5,274,474 | 12/1993 | Medina | 358/462 |
| 5,313,467 | 5/1994 | Varghese et al. | 370/468 |
| 5,339,174 | 8/1994 | Harris | 358/442 |
| 5,351,134 | 9/1994 | Yaguchi et al. | 358/435 |
| 5,418,624 | 5/1995 | Ahmed | 358/435 |
| 5,446,739 | 8/1995 | Nakano et al. | 370/337 |
| 5,473,601 | 12/1995 | Rosen et al. | 370/319 |
| 5,497,371 | 3/1996 | Ellis et al. | 370/412 |
| 5,511,073 | 4/1996 | Padovani et al. | 370/471 |
| 5,563,912 | 10/1996 | Yasunaga | 370/503 |
| 5,734,678 | 3/1998 | Paneth et al. | 370/330 |
| 5,812,545 | 9/1998 | Liebowitz et al. | 370/337 |
| 5,818,820 | 10/1998 | Anderson et al. | 370/280 |

FOREIGN PATENT DOCUMENTS

| | | | |
|---|---|---|---|
| 0399611 | 11/1928 | European Pat. Off. | H04M 1/72 |
| 0605312 | 7/1994 | European Pat. Off. | H04B 7/26 |
| WO9627975 | 9/1996 | WIPO | H04N 1/333 |

OTHER PUBLICATIONS

Digital Signal Processing Applications with the TMS320 Family, Texas Instruments, 1996.

*Primary Examiner*—Seema S. Rao
*Attorney, Agent, or Firm*—Volpe and Koenig, P.C.

[57] ABSTRACT

Two related voiceband compression techniques are employed in order to enable an RF telecommunications system to accommodate data signals of high speed voiceband modems and FAX machines. A High Speed Codec enables the telecommunications system to pass voiceband modem and FAX transmissions at up to 9.6 kb/s. An Ultra-High Speed Codec supports voiceband modem and FAX transmissions up to 14.4 kb/s. The High Speed Codec operates using three 16-phase RF slots or four 8-phase RF slots, and the Ultra-High Speed Codec operates using four 16-phase RF slots. Because these codecs transmit information over several RF slots which can be contiguous, the slots within RF communication channels are dynamically allocated. The Dynamic Timeslot/Bandwidth Allocation feature detects and monitors the data transmission and forms a data channel from the necessary number of slots.

6 Claims, 16 Drawing Sheets

METHOD AND APPARATUS FOR COMPRESSING AND TRANSMITTING HIGH SPEED DATA

FIELD OF THE INVENTION

This invention relates to a communication system and, more particularly, signal processing techniques for compression of high speed data communication signals for improved transmission performance and increased communication system capacity.

BACKGROUND OF THE INVENTION

Telecommunication systems are well known in the art, and today's telephone systems employ various multiplexing techniques to transmit telephone signals of many users over a single transmission line, such as wire or fiber-optic cable. Most of these "hard-wired" systems employ a form of Time Division Multiplexing (TDM) in which a multiple channels are transmitted sequentially at rates higher than the channel information rate.

Typical telephone multiplexing requires sampling of the telephone signal and transmitting the samples at a frequency much higher than the frequency of the telephone signal. To this end, present systems digitally sample and encode the telephone signal, multiplex and transmit the signal, and then receive, demultiplex and decode the signal. One such sampling and encoding system is Pulse Code Modulation (PCM) in which analog voiceband signals are sampled at a rate of 8 kilosamples per second with each sample represented by 8 bits. Consequently, the voiceband signal is converted to a 64 kilobit per second (kb/s) digital signal.

Another form of telecommunication system is the radio telephone system. Radio telephone systems utilize a group of selected radio frequencies (RF) for carrying telephone communication signals between two or more locations, and typically employ a form of Frequency Division Multiple Access (FDMA). These radio systems, termed wireless communication systems, are used, for example, in rural locations to provide local telephone service or in mobile units to provide mobile communication services.

One category of RF communication systems employs TDM to allow access of users to multiple information timeslots modulated on the RF carrier. If many users compete for a small group of information timeslots, the system is termed time division multiple access (TDMA). To allow for TDMA of the FDMA RF communication channels, a method, called FDMA/TDMA and described in U.S. Pat. No. 4,675,863 (incorporated herein by reference), has been employed to increase capacity of RF communication systems. However, RF communication systems are still frequently limited in capacity when compared to hard-wired or fiber-optic communication systems.

Consequently, to increase capacity even further, signal compression techniques have been used to reduce the bandwidth required for transmission of a telephone signal over an RF channel. Typical techniques used for voice signals are sub-band coding, Adaptive Differential Pulse Code Modulation (ADPCM), and Residual Linear Predictive Coding (RELP). RELP or similar speech compression algorithms allow a 64 kilobit per second (kb/s) sampled and quantized voice signal to be transmitted over the RF channel as a reduced bit rate (for example, 14.6 kb/s or less) signal. The receiver reconstructs the 64 kb/s voice signal from the reduced bit rate signal, and the listener perceives little or no loss in signal quality.

The underlying method of speech compression, including RELP, is an encoding and decoding algorithm which take advantage of known characteristics of voice signals. One type of RELP method assumes certain characteristics of the harmonics of the human voice. Today, however, a large portion of the communication signals within a telephone network are non-voice data communications signals such as facsimile (FAX) or voiceband modem data. Unfortunately, speech compression algorithms are not particularly compatible with these data communications signals because the data signals do not exhibit the characteristics of voice signals.

Accordingly, some RF communication systems monitor the telephone signal to detect the presence of a data communication signal. Typically, data signals representing either FAX or voiceband modem data signals up to 2.4 kb/s (low speed data) have been detected and provided a specialized compression algorithm. The receiver reconstructs the data signal without reducing the transmission data rate. Such a system and method is disclosed in, for example, U.S. Pat. No. 4,974,099 (incorporated herein by reference). Today's telephone data signals, however, are more typically 9.6 kb/s (high speed data) or higher (ultra high speed data, such as 14.4 kb/s or 28.8 kb/s or others, higher or lower), and the present compression techniques do not compress these higher data speeds satisfactorily. Compression of these higher data rates, and especially multiple encodings of these higher data rates, cause a degradation of modem or FAX signal quality, and the modem or FAX machine will frequently reduce the data transmission rate when the signals are passed through a RF communication system.

SUMMARY OF THE INVENTION

A telecommunications system receives a group of telephone signals, including data signals each having a form of encoding, and transmits the telephone signals on at least one radio frequency (RF) carrier. Each RF carrier has a group of information slots, and each telephone signal is assigned to at least one information slot so that the telephone signal is modulated on the RF carrier. The system includes a process for monitoring and identifying the data signals, and for compressing each data signal to reduce the required transmit bandwidth of the data signal.

BRIEF DESCRIPTION OF THE DRAWINGS

The invention is best understood from the following detailed description when read in connection with the accompanying drawings, in which.

OVERVIEW

Figure 1:
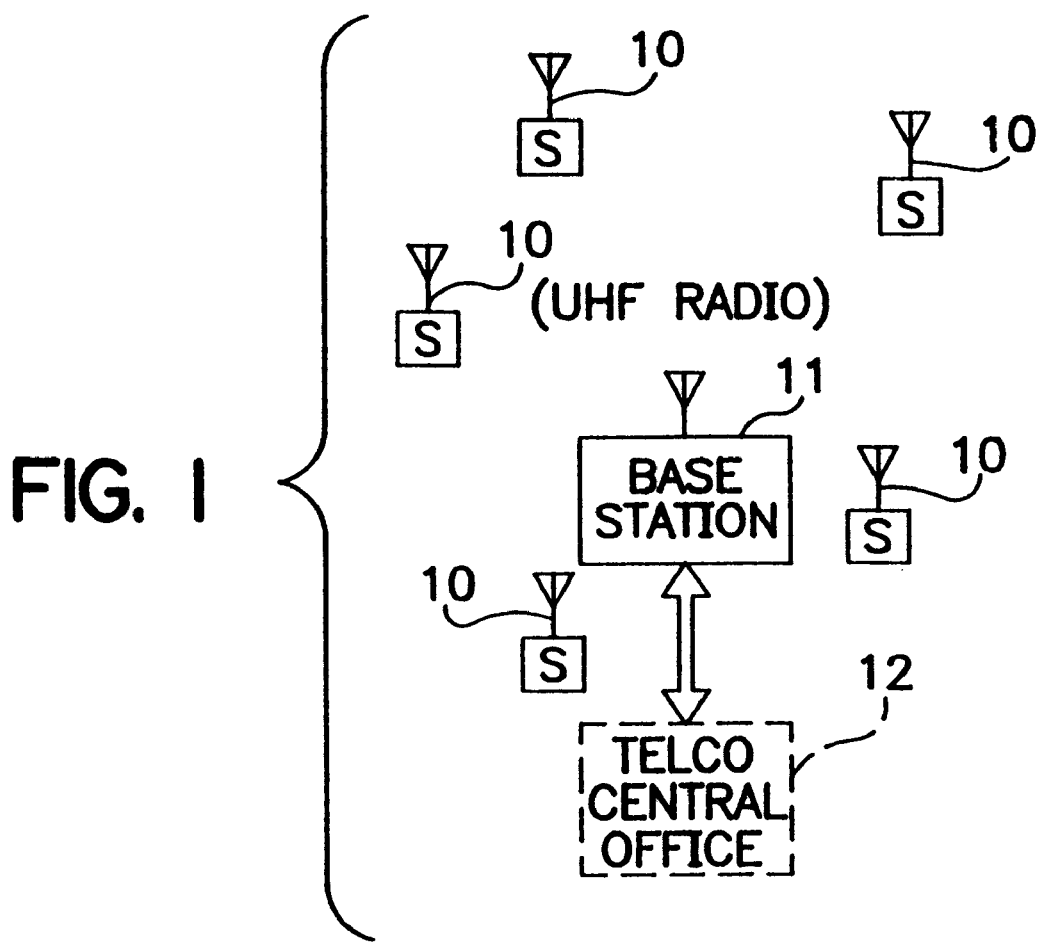
FIG. 1 is a block diagram of a wireless communication system.

A telecommunications apparatus and method receives telephone signals and modulates each of the telephone signals onto a respective transmit radio frequency (RF) carrier. Each transmit RF carrier has a predetermined number of information slots, and each telephone signal is assigned to at least one information slot so that the telephone signal is modulated on the RF carrier. The telecommunications apparatus and method includes a detector to receive and monitor each of the telephone signals to detect a data signal contained in one of the telephone signals; and an encoder for encoding the data signal into a compressed, coded signal. The apparatus and method also includes a controller which checks an assignment status of each information slot when the data signal is detected, and locates a predetermined number of unassigned sequential information slots (but not necessarily contiguous) for a predetermined bandwidth required to transmit the compressed, coded signal. The assignment status indicates whether each information slot is unassigned or assigned to other telephone signals. The apparatus and method also includes a process to form a telecommunication channel from the located, unassigned sequential information slots, and a process to modulate the coded signal on the telecommunication channel.

According to one aspect of the present invention, a high speed data compression transmission system transmits a high speed data signal through a telecommunication channel as a compressed, coded signal. The high speed data signal is received as at least one data signal block of samples, and the system includes a high speed data encoder and a high speed data decoder. The high speed data encoder includes 1) a receiver for the data signal blocks which each contain at least one data signal sample representing a peak amplitude; 2) a calculator for calculating a data signal block gain value which is proportional to the peak amplitude value; and 3) a quantizer selector which selects a quantizer corresponding to the gain value.

The quantizer has a plurality of quantizing level values having a determined spacing (e.g. uniform) which are determined from the gain value, and the selected quantizer quantizes each data sample of the data signal block into a compressed data sample. The gain value and plurality of compressed data samples constitute the compressed, coded signal. The high speed data compression transmission system includes a transmitter to transmit the compressed, coded signal through the telecommunication channel and a receiver to receive the signal from the telecommunication channel.

The high speed data decoder of the high speed data compression transmission system includes 1) a receiver for the compressed data samples and the corresponding gain value; and 2) an inverse quantizer selector to select, based on the gain value, a uniform inverse quantizer having a plurality of uniformly spaced output values which are determined form the gain value. The inverse quantizer processes each of the compressed data samples based upon the gain value to provide a block of reconstructed data signal samples.

According to another aspect of the present invention, an ultra high speed data compression transmission system transmits an ultra high speed data signal through a telecommunication channel. The ultra high speed data signal is received as at least one data signal block of samples having a first quantization, and the system includes a ultra high speed data encoder and a ultra high speed data decoder. The ultra high speed data encoder includes 1) a receiver for the data signal block which contain at least one data signal sample having a peak amplitude; 2) a calculator for calculating a data signal block gain value which is proportional to the peak amplitude; and 3) a quantizer selector to select a new set of quantizer levels corresponding to the gain value of the block of samples, and each one of the new set of quantizer levels are selected levels of the first quantization; and 4) a quantizer level mapping processor which maps the signal sample value to a compressed level value for each signal sample value based upon a relationship between the set of levels of the first quantization and the new set of quantizer levels.

The gain value and the compressed data samples constitute a coded signal. The system also includes a transmitter to transmit the coded signal through the telecommunication channel, and a receiver to receive the coded signal from the telecommunication channel. The exemplary embodiment is described below with reference to a telecommunication channel of a wireless communication system. However, the present invention is not limited to wireless or other types of RF carrier communication. Rather, the present invention can also be used with telecommunication channels of wired communication systems to increase capacity.

The ultra high speed data decoder of the ultra high speed compression transmission system includes 1) a receiver for the compressed data samples and the corresponding gain value; 2) an inverse quantizer selector to select, based on the corresponding gain value, an inverse quantizer which has output values which are determined from the gain value and corresponding new set of quantizer levels. The inverse quantizer processes each of the compressed data samples based upon the gain value to provide a block of reconstructed data signal samples.

According to another aspect of the present invention, an ultra high speed data quantizing method maps from a first plurality of quantized signal samples, each signal sample having a corresponding quantized amplitude value and at least one signal sample having a peak quantized amplitude value, to a second plurality of quantized compressed samples and a gain value. The method includes 1) examining each amplitude to determine a peak amplitude value, and setting the gain value corresponding to the peak amplitude value; and defining for the first plurality of quantized signal samples a predetermined number of successive segments, each segment having a number of quantized level values. The quantized level values for each successive segment is related to the gain value, and a first segment of the predetermined number of successive segments corresponds to the peak amplitude of the plurality of signal samples.

The quantizing method further includes mapping each one of the quantized signal samples into quantized compressed samples by 1) retaining for each one of the quantized signal values, selected ones of the number of quantized level values for each segment until a zero-valued level is found, and 2) setting a sign value to a negative value to indicate a negatively valued amplitude.

DETAILED DESCRIPTION OF THE INVENTION

The Data Compression System

FIG. 1 is a diagram of a wireless telecommunication system in which may be implemented the High Speed Data Compression features of the present invention. As shown, the radio telecommunications system includes a base station 11 and a group of subscriber units 10. The base station 11 simultaneously communicates with the subscriber units 10 by broadcast and reception of communication channels defined over a range of preselected radio frequencies. The base station 11 may also interface with the local telephone equipment in the Telco Central Office 12.

A typical radio telecommunications system (for example, the SLS-104, manufactured by InterDigital Communications Corporation, King of Prussia, Pa.) utilizes 24 predetermined forward channels (base station to subscriber unit) and 24 predetermined reverse channels (subscriber unit to base station) within the 300–500 Megahertz (MHz) spectral region. Base station to subscriber unit communication is provided through pairs of communication channels (forward and reverse) modulated on frequencies within this spectral region. In a typical system, the base station 11 simultaneously communicates over these 24 channel pairs. The 24 channels may occupy, for example, 2 MHz frequency bands. The 2 MHz frequency band may support more channels, for example, 80 channels, by employing 25 kHz channel spacing. In one embodiment of the system, the base station 11 can transmit to a subscriber on the lower frequency of a pair, and the subscriber unit 10 can transmit to the base station on the higher frequency pair. Such a system is described in U.S. Pat. No. 4,675,863, issued Jun. 23, 1987, entitled SUBSCRIBER RF TELEPHONE SYSTEM FOR PROVIDING MULTIPLE SPEECH AND/OR DATA SIGNALS SIMULTANEOUSLY OVER EITHER A SINGLE OR A PLURALITY OF RF CHANNELS to Paneth et al. which is hereby incorporated by reference.

In order to increase communication capacity, time division multiple access techniques are used on each carrier frequency. In one exemplary system, each frequency of the channel pair is divided into four time slots such that the base station 11 communicates simultaneously with up to four subscriber units 10 on one carrier frequency. Consequently, the base station, using 24 channel pairs, can allow telephone signals to be modulated on 95 channels, and use one channel for control and other overhead functions.

One aspect of increasing capacity in this manner is to compress the telecommunication channels to be transmitted over the RF communication channel (or wired channel). For voice, as previously described, speech encoding techniques such as RELP can be used. Also, low speed data and low speed facsimile data compression techniques can be used, as are described in U.S. Pat. No. 4,974,099 entitled COMMUNICATION SIGNAL COMPRESSION SYSTEM AND METHOD to Lin et al. which is hereby incorporated herein by reference.

In the previously described system, three voiceband coders, RELP, Low Speed Data, and Low Speed FAX, compress 64 kb/sec PCM signals to a 14.5 kb/s signal. At 14.5 kb/s, these three coders can operate within a single 16-phase RF slot or a double-wide 4-phase RF slot. The RELP coder is used for voice, the low speed data coder is used to pass a number of voiceband modem transmissions at rates up to 2400 BPS, and the low speed FAX coder is used to pass Group 3 FAX transmissions at 2400 BPS. Each transmitting coder has a corresponding decoder within a receiver, which can, or example, be assigned through the system control channel.

In order to enable the telecommunications system to accommodate high speed voiceband modems and FAX machines, the two related voiceband compression techniques of the present invention are employed. The coders and decoders (codecs), designated the High Speed Codec and the Ultra-High Speed Codec, achieve better compressed data transmission performance than the low speed data and FAX coders, by employing less compression and hence providing more bandwidth to the data signal.

The High Speed Codec enables the telecommunications system to pass voiceband modem and FAX transmissions at up to 9.6 kb/s. The Ultra-High Speed Codec supports voiceband modem and FAX transmissions up to 14.4 kb/s and higher. The High Speed Codec operates using three 16-phase RF slots or four 8-phase RF slots. The Ultra-High Speed Codec operates using four 16-phase RF slots. Preferably, the High Speed data and Ultra High Speed Data compression algorithms pass a representation of an analog voiceband waveform over a digital channel with constrained data rates while minimizing detrimental distortion.

Since these codecs use several RF slots, dynamic re-allocation of the slots within the RF communication channels is necessary. The Dynamic Timeslot/Bandwidth Allocation feature of the present invention detects and monitors the data transmission and forms a data channel from the necessary number of slots, but if the number of required slots is not available, the low speed data or low speed FAX coder is assigned to the call. Such assignment methods are described, for example, in U.S. Pat. No. 4,785,450, issued Nov. 15, 1988, entitled APPARATUS AND METHOD FOR OBTAINING FREQUENCY AGILITY IN DIGITAL COMMUNICATION SYSTEMS, to D.R. Bolgiano et al. which is hereby incorporated herein by reference.

Figure 2:
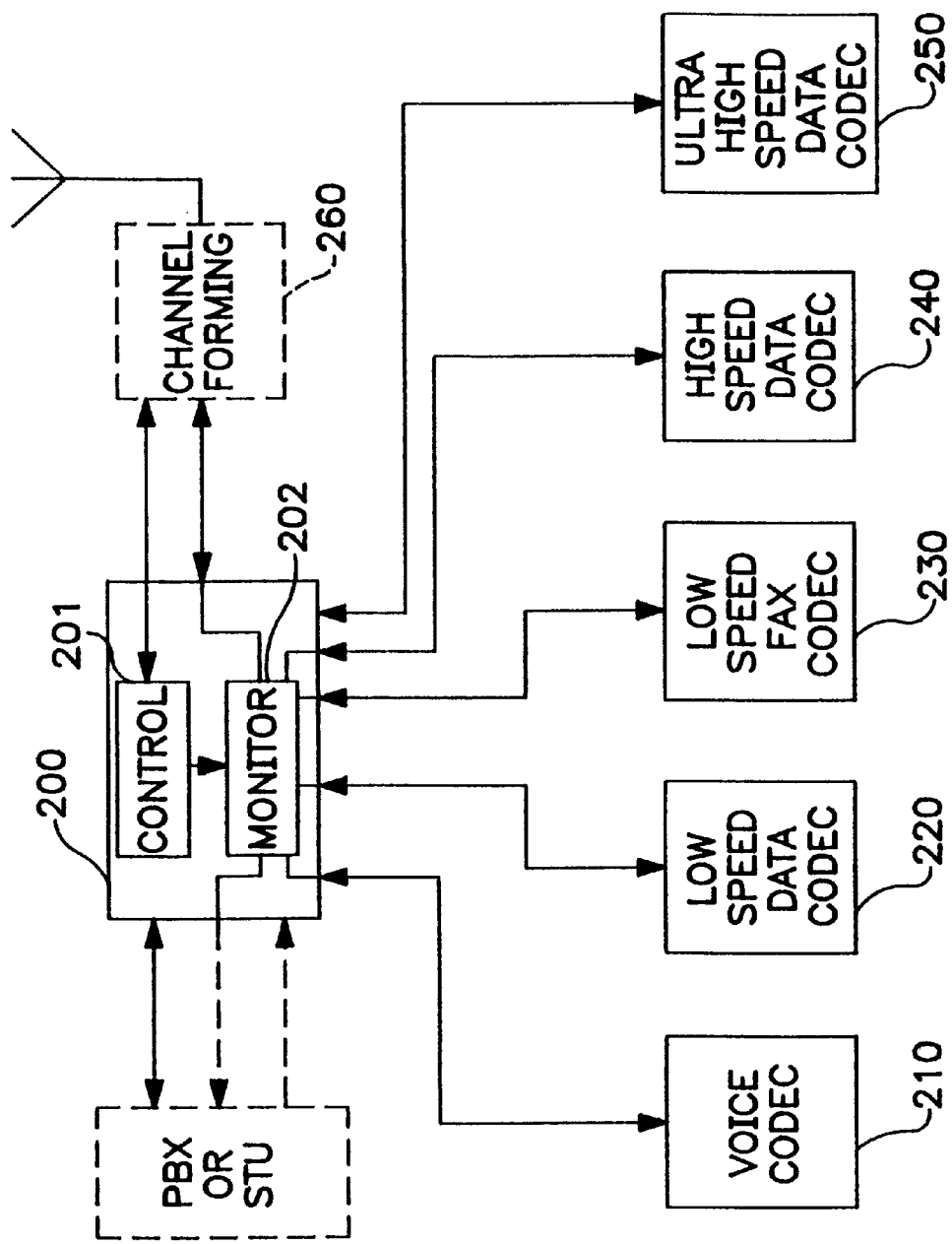
FIG. 2 is a high level block diagram of the implementation of the Compression System of the present invention, including the Dynamic Bandwidth Allocation feature, and the High Speed and Ultra High Speed Data codecs.

FIG. 2 is a high level block diagram of the implementation of the Compression System of the present invention, including the Dynamic Timeslot/Bandwidth Allocation feature, and the High Speed and Ultra-High Speed Data codecs, for high speed data compression of the exemplary embodiment of a wireless telecommunication system. The system includes: a Compression Selector Processor (CSP)

200, which includes a Control Unit 201 and Monitor Section 202; a Channel Forming processor 260; and the compression coders/decoders (CODECs) RELP 210, low speed data 220, low speed FAX 230, High Speed Data 240 and Ultra-High Speed Data 250.

The CSP 200 receives the telephone signal from the local telephone exchange 270 and is a digital processor designed to implement monitoring of the telephone signal to identify specific types of data signals by their respective modem answer tones, and to initiate the set-up of the communication channel. In another exemplary embodiment using subscriber to subscriber communications, the CSP 200 can receive the telephone signal from other local sources. The CSP 200 Monitor section 202 informs the Control Unit 201 of the presence of the data signal. The Control Unit 201 is responsible for implementing the external formation of a RF communication channel, as well as assigning a type of compression CODEC 210, 220, 230, 240 and 250.

The Channel Forming processor 260 receives a transmit channel request from the CSP 200 and allocates an available RF communication slot to a telephone signal. The Channel Forming processor 260 keeps the current system channel assignment information in a memory (not shown) to determine which timeslots are not currently used for other telephone signals. As is known in TDMA systems, each channel time slot is formed with a guard time, which is a short period of signal used to initialize a receiver before data is sent. In the presence of data signals requiring more than one RF time slot, the Channel forming processor 260 forms the channel from a predetermined number of time slots, and if the predetermined number of timeslots is contiguous, only one guard time is used.

The Channel Forming processor 260 of one exemplary embodiment of the invention may be a Radio Processor Unit (RPU) of a network base station. The RPU can be responsible for storing channel time slot assignments and allocating channel time slots for the entire system of FIG. 1.

The RELP CODEC 210 implements the compression coding (and decoding) algorithms for voice signals. The Low Speed Data CODEC 220 and Low Speed FAX CODEC 230, High Speed Data CODEC 240 and Ultra-High Speed Data CODEC 250 implement the respective data compression algorithms for voiceband data of the identified type.

Generally, the CSP 200 and the CODECs 210, 220, 230, 240, and 250 can be integrated into a digital signal processor to implement data signal monitoring, signal processing, and signal compression coding and decoding operations. One such processor is chosen, for example, from the Texas Instruments TMS 320C5X family of Digital Signal Processor.

The operation of the compression system of the present invention is now described. Still referring to FIG. 2, when the voice call is first established, the voice RELP codec 210 is initially assigned to the telephone signal. The CSP 200 monitors the telephone signal through the Monitor section 202, and the Control unit 201 determines the type of voiceband signal based upon the detection of the modem answer signal. Each type of voiceband data has a particular, identifiable modem answer signal. Table 1 summarizes some of the typical various modem originate and answer characteristics, which are well known in the art. Table 1 is for illustrative purposes and is not, however, intended to describe all possible modem characteristics.

TABLE 1

Voiceband Modem Characteristics

| V.??/ | EC | | Answer (or backchannel) | | | | | Originate | | | | |
|---|---|---|---|---|---|---|---|---|---|---|---|---|
| BPS | disable | Duplex | fc | mod | fs | mark | space | fc | mod | fs | mark | space |
| V.16 | NO | B | 480 | FSK | 200 | 570 | 390 | 950<br>1400<br>2100 | FM | | | |
| V.16 digital | NO | B | 480 | FSK | 200 | 570 | 390 | 1400 | FSK | 100 | 1480 | 1320 |
| V.19 | NO | | 420 | AM | 5 | | | | DTMF | | | |
| V.19 alt1 | NO | B | 1750 | FSK | <=300 | 1850 | 1650 | | DTMF | | | |
| V.19 alt2 | NO | B | 420 | FSK | <=75 | 390 | 450 | | DTMF | | | |
| V.20 | NO | B | 420 | AM | 5 | | | | MTFSK | | 920–1960 | |
| V.20 alt | NO | B | 460 | FSK | <=75 | 420 | 480 | | MTFSK | | 920–1960 | |
| V.21 | 2100 | F | 1750 | FSK | <=300 | 1850 | 1650 | 1080 | FSK | <=300 | 1180 | 980 |
| V.22 1200 | 2100 | F | 2400 | 4 DPSK | 600 | | | 1200 | 4 DPSK | 600 | | |
| V.22 bis 2400 | 2100 | F | 2400 | 16 QAM | 600 | | | 1200 | 16 QAM | 600 | | |
| V.23 1200 | 2100 | B | 420 | FSK | <=75 | 390 | 450 | 1700 | FSK | <=1200 | 1300 | 2100 |
| V.23 600 | 2100 | B | 420 | FSK | <=75 | 390 | 450 | 1500 | FSK | <=600 | 1300 | 1700 |
| V.26 ter | 2100 | F/H | 1800 | 4 DPSK | <=75 | | | 1800 | 4 DPSK | 1200 | | |
| v.27 ter 4800 | 2100 | H | 1800 | 8 DPSK | 1200 | | | 1800 | 8 DPSK | 1200 | | |
| v.27 ter 2400 | 2100 | H (B) | 1800 | 4 DPSK | 1200 | | | 1800 | 4 DPSK | 1200 | | |
| V.29 9600 | 2100 | H | 1700 | 16 QAM | 2400 | | | 1700 | 16 QAM | 2400 | | |
| V.29 7200 | 2100 | H | 1700 | 8 QAM | 2400 | | | 1700 | 8 QAM | 2400 | | |
| V.29 4800 | 2100 | H | 1700 | 4 PSK | 2400 | | | 1700 | 4 QAM | 2400 | | |
| V.32 9600 | 2100 | F | 1800 | 16 QAM | 2400 | | | 1800 | 16 QAM | 2400 | | |
| V.32 4800 | 2100 | F | 1800 | 4 PSK | 2400 | | | 1800 | 4 PSK | 2400 | | |
| FAX 300 BPS chan | | H | 1800 | FSK | | | | | | | | |

Returning to FIG. 2, once the type of voiceband data is determined, if the High Speed Data or the Ultra-High speed data compression is required, the CSP 200 initiates voice channel reassignment, and the method of Dynamic Timeslot Allocation used is described below. The Control Unit 201 signals the Channel Forming processor 260 to form a RF communication channel with a predetermined number of timeslots. In one embodiment of the present invention, a time slot is automatically assigned to the call, but this is not required. The Channel Forming processor 260 examines the memory to determine the number and RF carrier location of available RF timeslots. If the Channel Forming processor locates the number of predetermined slots, the RF communication channel is formed from the predetermined number of RF timeslots and the Control Unit 201 is notified. The Control Unit 201 then assigns a corresponding High Speed Data Codec or Ultra-High Speed Data Codec to the data signal, and the compressed data signal is assigned to and modulated on the formed multiple slot RF communication channel.

If there are not enough time slots available, the Control Unit 201 is informed and a RF communication channel is formed from a single RF time slot, and the Control Unit 201 then assigns the low speed data CODEC or Low Speed FAX CODEC to the data signal. As previously indicated, one embodiment of the present invention automatically assigns a time slot when the telephone signal is received prior to forming a multiple time slot communication channel, and so the telephone signal is already assigned a slot at this point.

The Dynamic Timeslot/Bandwidth Allocation

Table 2 summarizes the time slot requirements for the types of signal compression:

TABLE 2

| Coder | #4-phase slots | #8-phase slots | #16-phase slots |
|---|---|---|---|
| RELP | 2 | N/A | 1 |
| Low Speed Data | 2 | N/A | 1 |
| Low Speed FAX | 2 | N/A | 1 |
| High Speed Data | N/A | 4 | 3 |
| Ultra-High Speed Data | N/A | N/A | 4 |

Since the High Speed Encoder modulates data on both a three slot 16-phase channel and a four slot 8-phase channel, its compressed data desirably fits into one of the two channels having less bandwidth. The bit availability for the various channel types of the embodiment for the described radio telecommunication system of FIG. 1 is shown in Table 3.

In Table 3, "Nulls" indicates that no modulation is present, the Preamble is a bit synchronization patter, and "CW" stands for codeword, which includes call control, call processing and signaling information. The A-Block and B-Block represent a first and second 22.5 msec block of compressed voiceband data samples.

As seen in Table 3, the four slot 8-phase channel carries fewer bits than the three slot 16-phase channel. The High Speed Encoder's compressed output block of one embodiment of the present invention, therefore, may occupy 1041 bits or fewer. Table 4A shows the allocation of bits of the High Speed Data Encoder's compressed output block.

TABLE 4A

| Data | Bits per Instance | Quantity | Protected | Number of Bits |
|---|---|---|---|---|
| Coded Sample | 5 | 180 | yes | 900 |
| Coded Gain | 6 | 1 | yes | 6 |
| Protected Spare | 1 | 6 | yes | 6 |
| Hamming Parity | 7 | 16 | N/A | 112 |
| Spare | 1 | 24 | no | 24 |
| Total Per Block | | | | 1048 |

In Table 4A "Protected" indicates that forward error correction (FEC) is applied to the bit stream. The Ultra-High Speed Encoder's bit stream modulates a four slot 16-phase channel, from which 1408 bits are available for the coder's data in each 22.5 msec time period.

Table 4B shows the allocation of bits of the Ultra-High Speed Data Encoder's compressed output block.

TABLE 4B

| Data | Bits per Instance | Quantity | Protected | Number of Bits |
|---|---|---|---|---|
| Coded Sample | 7 | 180 | yes | 1260 |
| Coded Gain | 7 | 1 | yes | 7 |
| Protected Spare | 13 | 1 | yes | 13 |
| Hamming Parity | 7 | 16 | N/A | 112 |
| Unprotected Spare | 16 | 1 | No | 16 |
| Total Per Block | | | | 1408 |

The High Speed Data and Ultra High Speed Data compression techniques described below are embodiments of the present invention that may require multiple timeslots for a communication channel, but other compression techniques of the same spirit as that described herein can be developed for other specific types of data signals which do not neces-

TABLE 3

| Mod Level, Slots | Mode | start nulls | preamble | CW | A block | B block | end nulls | Data Bits/ Block |
|---|---|---|---|---|---|---|---|---|
| 16-PSK, 1 | voice/channel test | 0 | 5 | 3 | 80 | 84 | 8 | 328 |
| 16-PSK, 3 | voice (HSD) | 0 | 5 | 3 | 262 | 262 | 8 | 1048 |
| 16-PSK, 4 | voice (UHSD) | 0 | 5 | 3 | 352 | 352 | 8 | 1408 |
| 8-PSK, 1 | channel test | 0 | 14 | 4 | 154 | 0 | 8 | 462 |
| 8-PSK, 4 | voice (HSD) | 0 | 14 | 4 | 347 | 347 | 8 | 1041 |
| 4-PSK, 2 | voice/channel test | 0 | 13 | 6 | 160 | 173 | 8 | 328 |
| BPSK, 1 | RCC | 8 | 44 | 8 (UW) | 112 | 0 | 8 | 112 |
| BPSK, 1 | Refinement | 0 | 52 | 8 (UW) | 112 | 0 | 8 | 112 | sarily follow the voiceband modem characteristics described previously. These other embodiments can also employ the Dynamic Timeslot/Bandwidth Allocation method as used in the present invention.

Figure 3A:
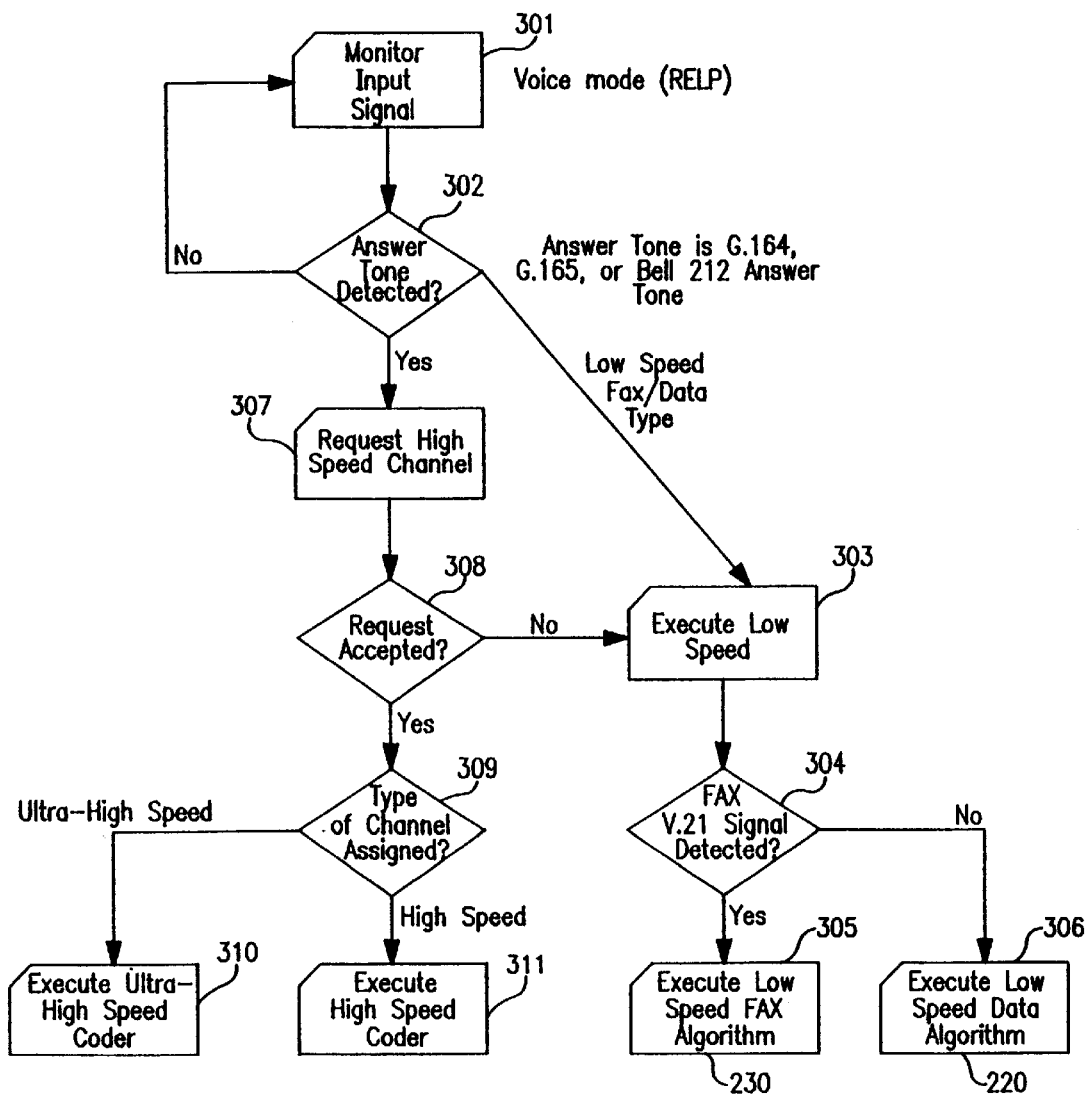
FIG. 3A is a high level flowchart illustrating the detection and selection of high speed data encoding types, and the determination and assignment of radio channel slots in accordance with an exemplary embodiment of the present invention.

The general Dynamic Timeslot/Bandwidth Allocation method is now described. FIG. 3A illustrates the process of Dynamic Timeslot/Bandwidth Allocation as implemented in, for example, the CSP 200 of FIG. 2. Referring to FIG. 3A, when the voice call is first established, the voice monitoring step 301, monitors the telephone to detect a data signal. At step 301, the RELP codec 210 is initially assigned to the telephone signal. However, when a data signal is present, the decision step 302 determines the type of voiceband signal based upon the detection of the modem answer signal.

If the data is low speed data or low speed FAX, step 303 assigns the low speed assignment process to which, for example, a single RF carrier slot has been assigned. Then step 304 determines whether the data signal is FAX or low speed data, and assigns the respective algorithm steps 305 and 306 of the Low Speed FAX Codec 230 or Low Speed Data Codec 220.

If the signal is of a high speed data type at step 302, then, the next step 307 requests a High Speed Data Channel from the Channel Forming Process 260, In one embodiment of the present invention, the Channel Forming Process 260 will require user/subscriber provisioning information to request the type of channel. Another embodiment of the present invention can further determine from the modem signals whether the data signal requires the High Speed Data or the Ultra-High Speed Data compression method in order to request the correct type of channel.

Figure 3B:
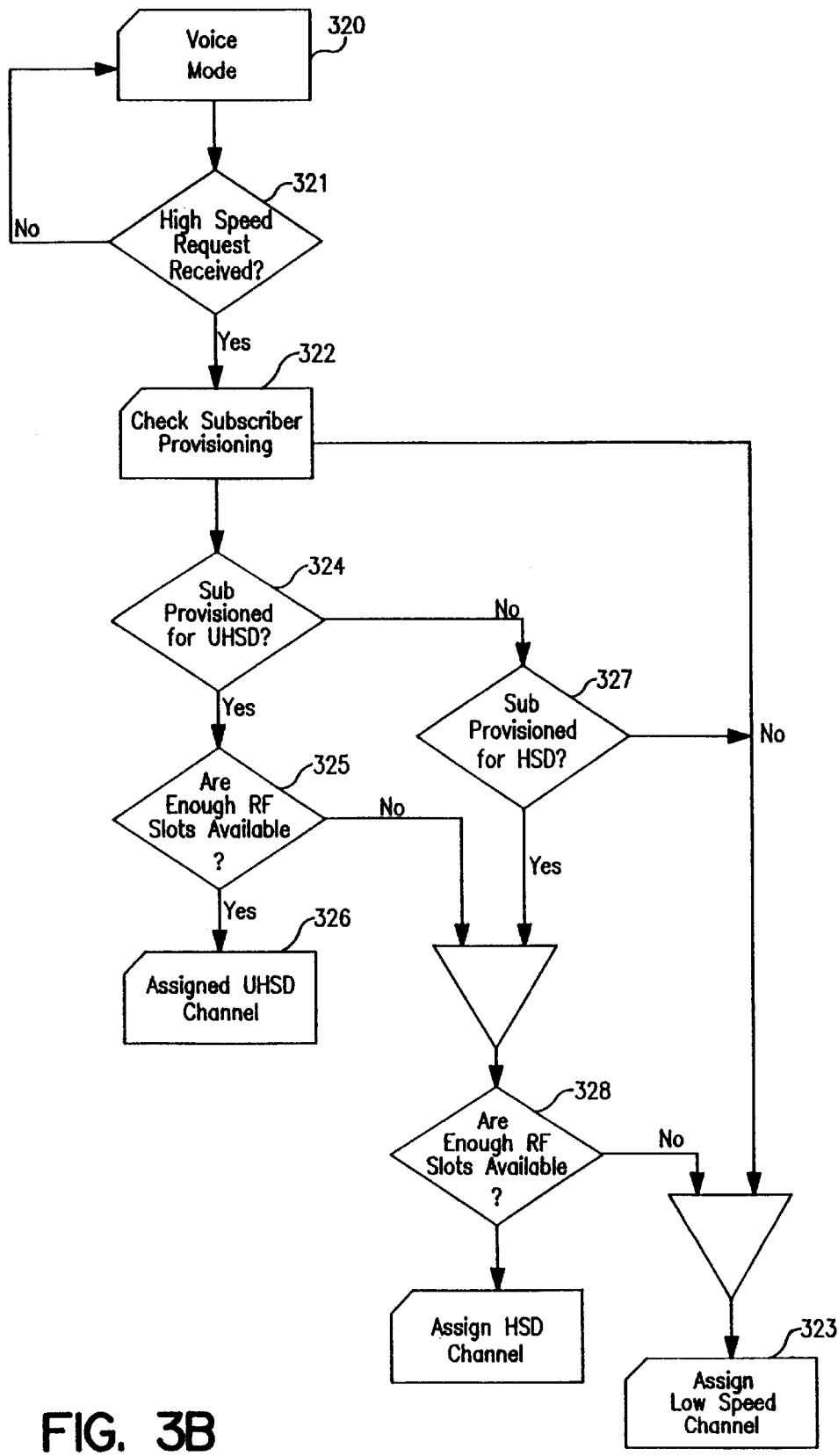
FIG. 3B is a high level flowchart showing the process of channel allocation performed by the Channel Forming Processor upon request for a High Speed Data Channel according to one embodiment of the present invention

FIG. 3B shows the process of channel allocation performed by the Channel Forming Processor 260 upon request for a High Speed Data Channel from step 307 of FIG. 3A. The Channel Forming Processor can be a base station radio processing unit (RPU) of the exemplary prior art system previously described, and the RPU can allocate RF carrier timeslots to subscriber communications through a communication channel.

Beginning at step 320 of FIG. 3B, the processor normally allocates a voice channel for a telephone call; however, any initial process allocation can be chosen, such as described in U.S. Pat. No. 4,675,863. Next, step 321 checks for a request for a High Speed Data Channel from step 307 of FIG. 3A. If no request is present, the allocation remains in the default mode, which is voice for this exemplary embodiment. If a request is present, step 322 checks for subscriber provisioning to determine whether the subscriber is provisioned to accept a High Speed Data Channel. If the subscriber is not provisioned to accept a High Speed Data Channel, a Low Speed Data/Fax channel is assigned at step 323 using a predetermined number of slots.

If the subscriber is provisioned for a High Speed Data Channel, step 324 determines whether the subscriber is provisioned to accept a High Speed Data Channel of the ultra high speed type ("UHSD Channel") (or if requested). If so, step 325 checks whether a predetermined number of RF carrier slots are available, and if so then step 326 creates the UHSD Channel. Step 325 may be embodied by a processor which checks a memory containing the current system channel assignments to find whether a required number of sixteen phase RF time slots are available (four for the exemplary embodiment). If the required number of slots are not available, then the process looks to see if the channel can be created as a high speed data type ("HSD Channel") as described subsequently in step 328.

If the subscriber provisioning (or the request) indicates the High Speed Data Channel should not be formed as an ultra high speed type UHSD Channel in step 324, step 327 checks whether the request or subscriber provisioning indicates the High Speed Data Channel should be formed as a high speed type HSD Channel. If not, the low speed data channel is formed at step 323 as previously described, but if the HSD Channel is requested or provisioned, then step 328 checks whether the predetermined number of RF carrier timeslots are available for the HSD Channel.

Step 328 may be embodied by a processor which checks a memory containing the current system channel assignments to find whether a first required number of time slots (sixteen phase RF time slots) are available (three for the exemplary embodiment), and if not, if a second required number of time slots (eight phase RF slots) are available (four for the exemplary embodiment). If the required number of slots is available, the timeslots are assigned and the HSD channel formed in step 329. If the High Speed Channel Availability step cannot find the required number of channels, then the step 323 simply assigns the low speed channel.

Returning to FIG. 3A, at step 308, the process checks the response to the High Speed Data Channel request. If at step 308 the request is denied and no High Speed Data Channel has been formed, then the steps 303 and sequence are executed to assign the low speed algorithms. If the High Speed Data Channel request is accepted, the High Speed Channel Availability step 309 determines which type of channel has been assigned. If the High Speed Data Channel corresponds to ultra high speed data, the coding algorithms of the Ultra-High Speed Data CODEC 250 are executed at step 310, and if the High Speed Data Channel corresponds to high speed data, the coding algorithms of the High Speed Data CODEC 240 are executed at step 311.

The High Speed and Ultra High Speed CODECs

The High Speed Codec 240 and Ultra High Speed Codec 250 provide compression of a bi-directional data channel of the present invention with sampled telephone signals (Pulse Code Modulation (PCM) telephone signals in the exemplary embodiment) as the input signal and output signal. The telephone signals provided to the sample compression process is typically 64 kb/s A-law or Mu-law PCM, but 128 kb/s 16 bit integer samples, or other types, can be used by employing a conversion process. The compression process compresses the 64 kb/s (or 128 kbs) sample bit stream to a lower data rate. The lower rate data is sent over the RF channel to the expansion process, which expands the lower rate data back to reconstructed 64 kb/s (or 128 kb/s) sample bit stream. The objective of the coder is that the synthesized or reconstructed samples be a close representation of the original sampled signal.

In PCM systems, analog voiceband signals are converted into a sequence of digital samples at a sampling rate of 8 Kilo-Samples/second. The samples are 8 bits wide, resulting in 256 possible quantization levels. When analog signals are sampled, an important figure of merit is the Signal to Quantization Noise Ratio (SQNR). For a uniformly spaced quantizer, the SQNR is 6B—1.24 dB where B is the number of bits per quantized sample.

An 8 bit uniform quantizer therefore has an SQNR of 46.76 dB, which is excellent for speech signals. This SQNR is only achieved if the original analog signal has an amplitude that occupies the entire dynamic range of the quantizer. If the dynamic range of the original signal exceeds that of the quantizer, clipping occurs. This is a very undesirable type of distortion for both speech and voiceband modem signals. If the original signal has a smaller dynamic range than that of the quantizer, the resulting SQNR is less than the optimum 46.76 dB. For every dB the signal's dynamic range is less than the quantizer's dynamic range, there is a loss of 1 dB of SQNR.

Figure 4A:
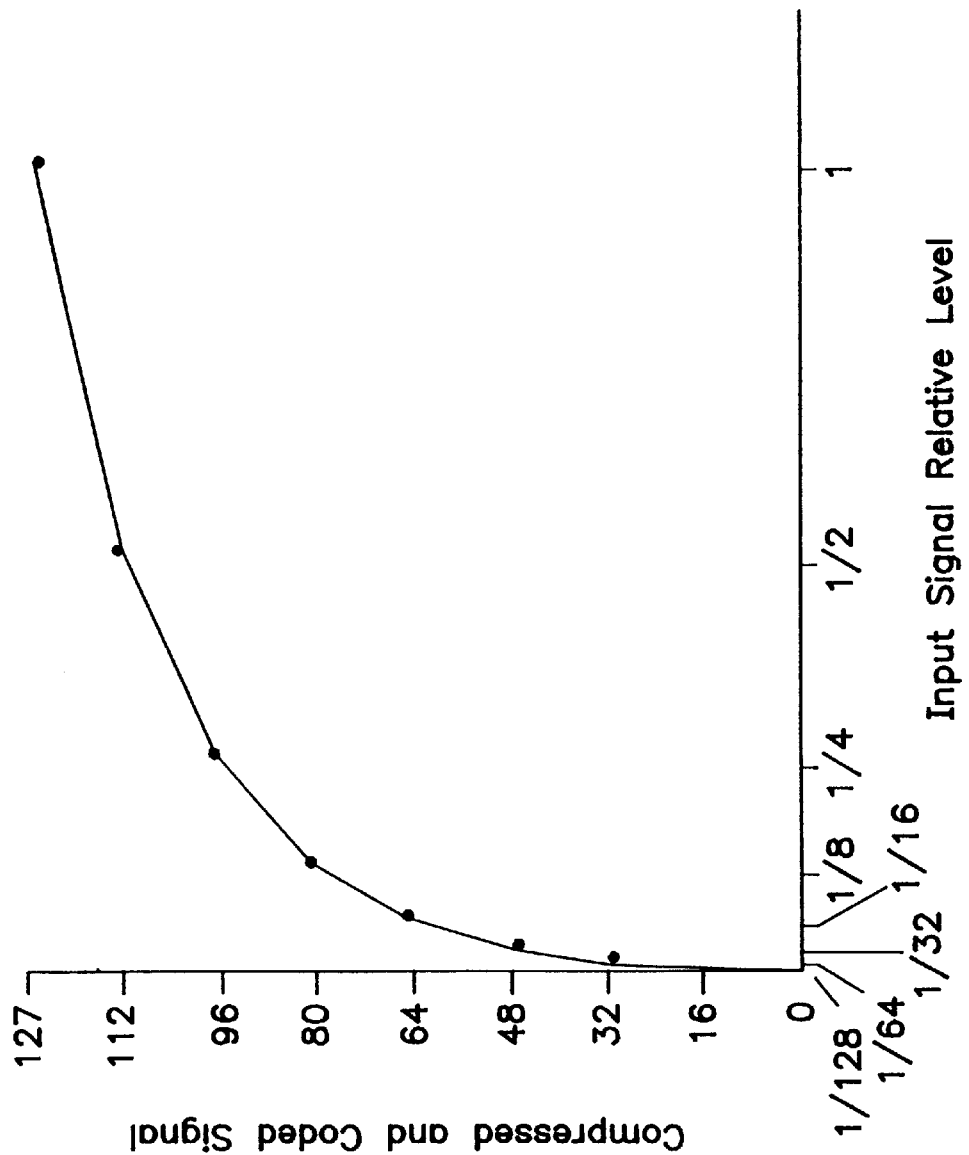
FIG. 4A is a graph showing the characteristics of the A-law Quantizer.

Since voiceband signals used in telephony have wide dynamic range, a uniform quantizer may not be the optimum choice. Thus, non-uniform quantizers are employed. There are two standards for non-uniform quantizers for PCM: Mu-law and A-law, and these standards are well known in the art, and are described in Chapter 8, Communication Systems, by Simon Haykin, which is incorporated herein by reference. Both techniques use logarithmically spaced quantizer levels in order to increase the dynamic range of the quantizers. FIG. 4A shows the characteristics of the A-Law quantizer.

The spacing between quantizer levels at high signal levels is larger than the spacing at low levels. The result is a more uniform SQNR on a sample to sample basis. While the best SQNR for these quantizers is less than that of the 8-bit uniform quantizer, these quantizers can provide a good SQNR over a wider range of signal levels.

Figure 4B:
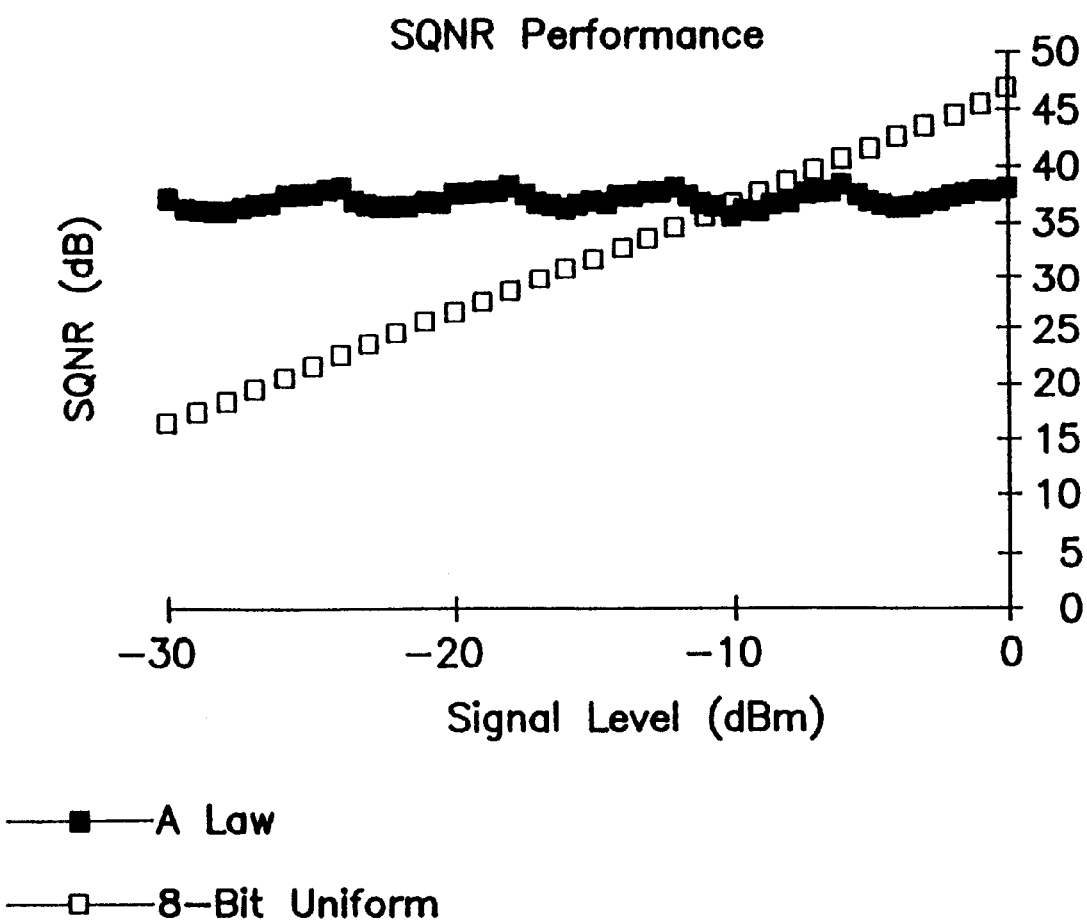
FIG. 4B is a graph showing the Signal to Quantization noise performance of PCM versus Uniform Quantization.

FIG. 4B compares the SQNR performance vs. signal level for A-Law and an 8-bit uniform quantizer. Although the uniform quantizer shows superior performance at high signal levels, the A-law quantizer retains a good SQNR over a wider dynamic range.

Voiceband modems operate well in a telephone network that employs either Mu-law or A-law 64 kb/s PCM because of the wide dynamic range. The transmit output level of these modems is high in order to use the channels to their fullest, but telephone channels have varying signal level losses. As a result, even though the modem output level is fixed at a high level, the level at another point in the network can be significantly lower. PCM's Dynamic range compensates for this situation.

Compressing 64 kb/s PCM to a lower data rate decreases the number of bits per sample and usually results in a significant decrease in SQNR. Distortion due to compression is minimized by the present invention by dynamically designing a quantizer to fit the dynamic range of the input signal. Once the two dynamic ranges are matched, the samples are quantized using a quantizer with the newly defined level spacing.

Figure 4C:
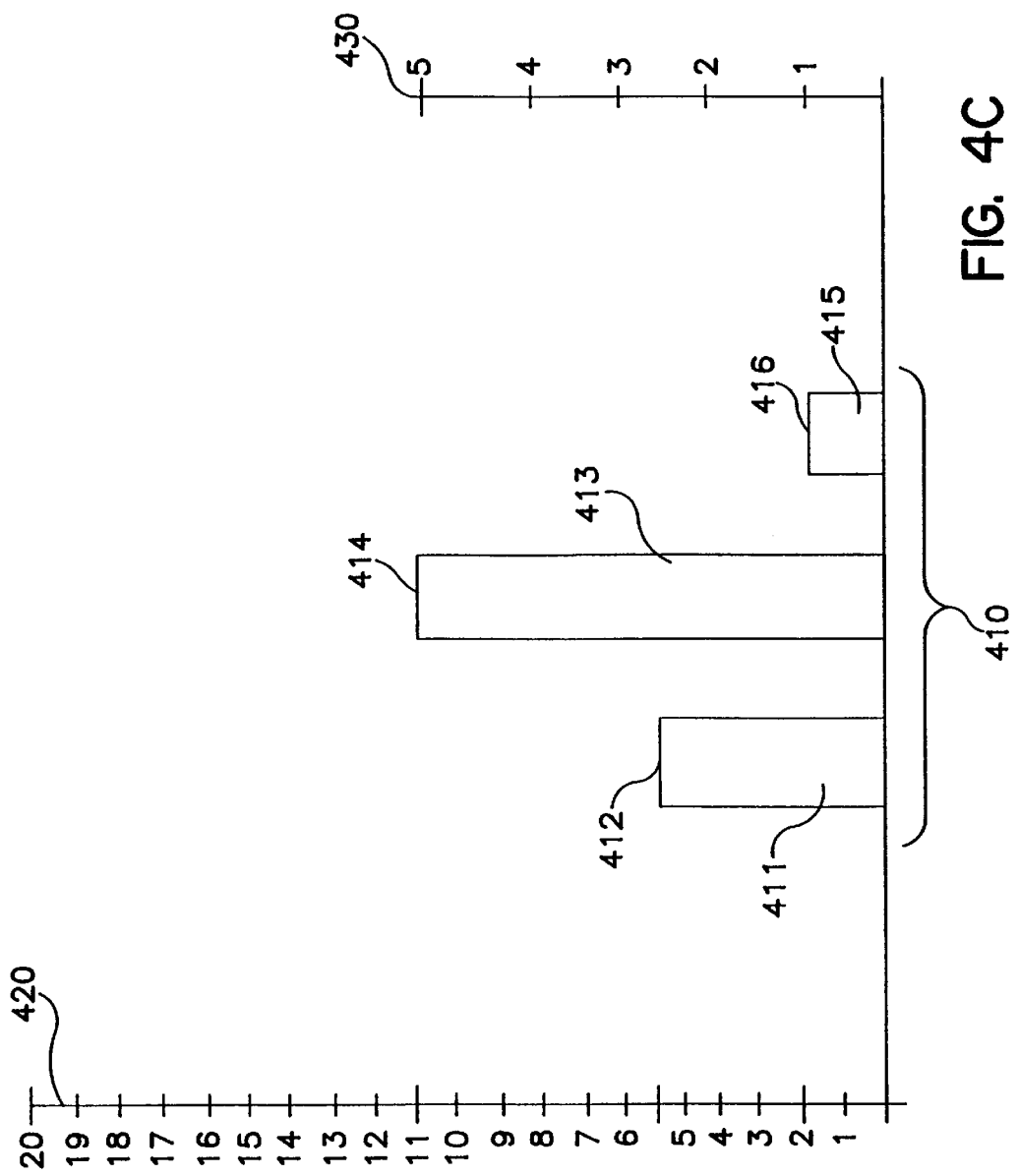
FIG. 4C illustrates the method of compression by mapping signal samples from one quantization to another quantization.

FIG. 4C illustrates a simple example of the method of compression by mapping the signal samples from one quantization to another quantization. A block of signal samples 410 consists of three samples 411, 413 and 415. A first set of quantization levels 420 indicates the approximate value of the sample amplitudes 412, 414 and 416. However, the quantization levels require that a certain number of information bits, five bits for the 20 levels shown of the first quantization, be transmitted to a receiver to represent one of the levels of the first quantization. To send three sample values corresponding to the three samples 411, 413, and 415, fifteen bits are desirable.

The exemplary method of the present invention defines a new set of levels for each block of signal samples based upon the peak amplitude. As shown in FIG. 4C, the block of samples 410 has sample 413 which has a peak amplitude value 414. The method defines a new quantization set of levels by defining the peak amplitude 414 as the highest level value, and determines a predetermined number of level values below this amplitude. As shown in FIG. 4C, this corresponds to 5 level values. For this new quantization, only three bits are necessary to define a level value, but the peak amplitude value must also be sent as a scaling factor to indicate the relationship between the new quantizer level values and the original quantizing level values. Consequently, five bits corresponding to the original peak amplitude value and nine bits (three per sample) are transmitted for the block of samples 410, or fourteen bits are necessary. The example shows that one fewer bit is sent; however, if there are ten samples in the block, the original quantizing method requires sending fifty bits, but the new quantizer only requires sending thirty five bits.

The following describes embodiments designed for the Mu-law and A-law standards. However, the techniques disclosed are easily extended to any system receiving samples quantized with a non-uniform companding quantizer.

The High Speed Data CODEC

Figure 5A:
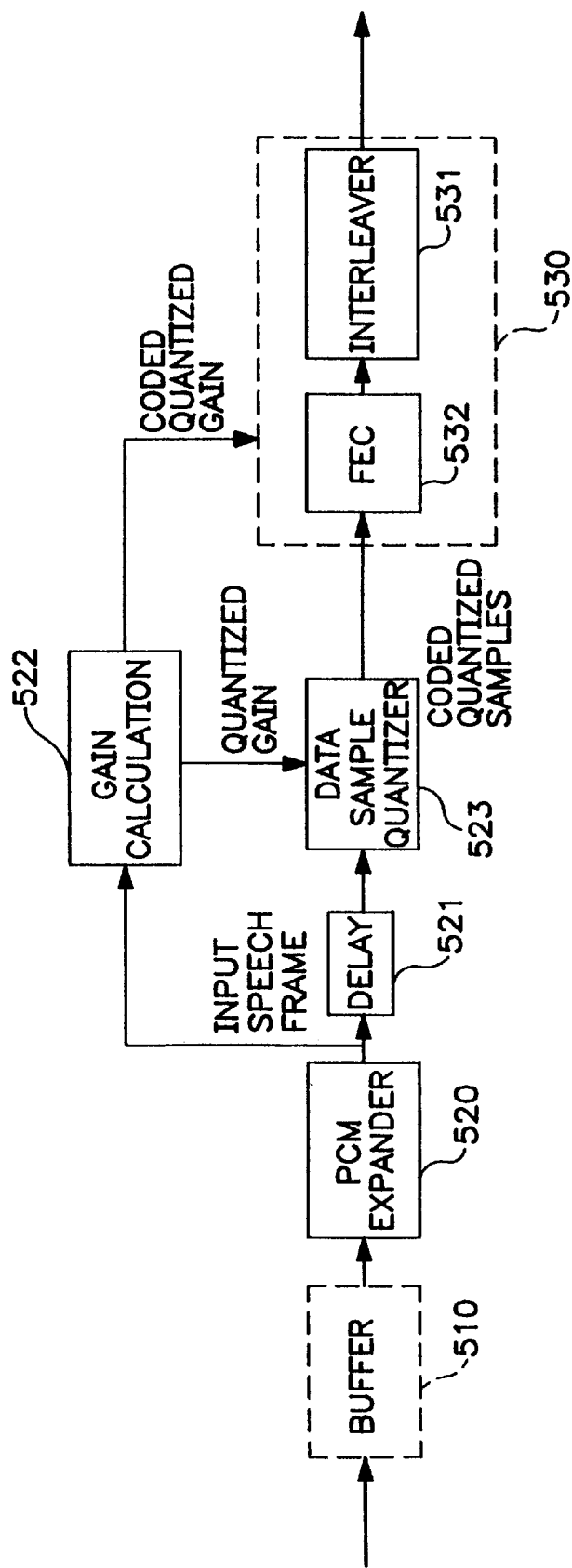
FIG. 5A is a high level block diagram of the High Speed Data Encoder in accordance with an exemplary embodiment of the present invention.

FIG. 5A is a high level block diagram of the High Speed Data Encoder. The encoder of the exemplary embodiment transforms data between 64 kb/s PCM and a 46.58 kb/s Forward Error Correction (FEC) Encoded compressed data stream. The compressed data rate is 40.267 kb/s, and the remaining transmitted bit stream is used for error correction.

As shown in FIG. 5A, the High Speed Data Encoder of the present invention includes an optional Buffer 510, a PCM Expander 520, a Gain Calculation process 522, a Delay 521, a Data Sample Quantizer 523, and an optional Transmission Encoding process 530. The Transmission encoding process 530 further includes a FEC encoder 532 and an Interleaver 531.

The optional Buffer 510 holds a predetermined number of samples to create a block of samples for the High Speed Data compression process. Alternatively, the samples can be received in a block format. The PCM Expander 510 converts the A-law or Mu-law PCM samples to linear samples. The Gain Calculation process 522 calculates the Quantized Gain value for the block of samples, and the Data Sample Quantizer uses the Quantized Gain value to create a uniformly spaced quantizer with quantization level values scaled by the Quantized Gain value. The delay shows that the Quantized gain value is determined before the compression process creates Encoded Quantized Samples, and the Transmission Encoding Process 530 is used to provide error correction coding for transmission of the encoded Quantized Gain and Encoded Quantized Samples.

The operation of the High Speed Data compression encoder is now described. As shown in FIG. 5A, the 64 kb/s PCM samples (A-law or Mu-law) are received by a Buffer 510. The Buffer 510 provides the PCM samples as 22.5 millisecond blocks of samples. At the 8 Kilo-Sample/second rate of the PCM, each block contains 180 samples. The Received PCM frame is fed into the PCM Expander 520, which converts the Mu-law or A-law samples into 16 bit linear samples (16 bit integer samples).

The resulting block of linear samples, which are 16 bit integer samples in the exemplary embodiment, is fed to the Gain Calculation process 522, which finds the sample in the block with the largest amplitude value (absolute value). The amplitude of this sample determines the Quantized Gain value for the block. The Quantized Gain value can be the amplitude value, the difference between the maximum sample value and the largest block amplitude, or a multiplier value. The Quantized Gain value is quantized using a 64 level logarithmically spaced quantizer. The Gain Calculation process 522 provides both the Quantized Gain and the Coded Quantized Gain value. The Coded Quantized Gain value is a 6 bit number that represents one of the 64 levels in the logarithmically spaced gain quantizer.

The Quantized Gain value from the Gain Calculation 522 and the block of samples from the PCM Expansion process are provided to the Data Sample Quantizer 523. The delay 521 is shown to indicate that the Gain Calculation process 522 must complete the task over the block before the samples are compressed by the Data Sample Quantizer 523. The Data Sample Quantizer 523 quantizes the 180 samples in the block using a 32 level uniformly spaced quantizer. The quantizer levels are dynamically adjusted on a block by block basis using the Quantized Gain value. Therefore, the uniformly spaced quantizer levels range form +Quantized Gain value to −Quantized Gain value for the current set of 180 samples. The Sample Quantizer outputs only the 5 bit encoded representation of the 180 samples since the compression does not require the actual quantized values.

The Encoded Quantized Gain and the Encoded Quantized Samples are optionally fed into the Transmission encoding process 530, which includes the Interleaver 531 and FEC Encoder 532. The FEC Encoder 532 is a (64,57) Extended Hamming encoder, and the Hamming code is capable of correcting a single bit error and detecting a double bit error in each 64 bit block. The FEC Encoder 532 receives the Coded Quantized Gain and the Coded Quantized Samples and provides them to the Interleaver 531, and the Interleaver 531 outputs Encoded Compressed Data. The Interleaver of one exemplary embodiment of the present invention is a 16*64 bit block interleaver.

Figure 5B:
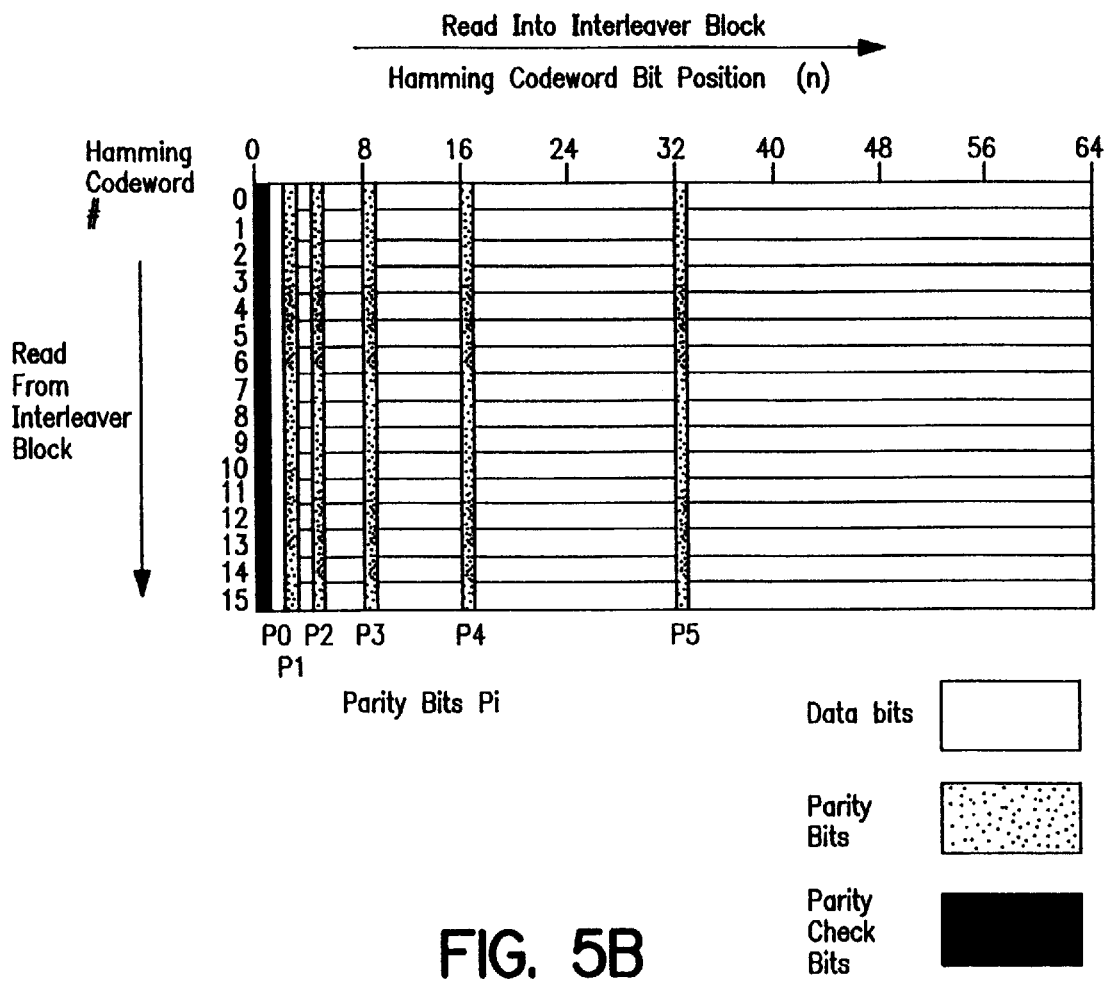
FIG. 5B illustrates a High Speed Data Encoder transmission encoding process in accordance with an exemplary embodiment of the present invention.

FIG. 5B shows one exemplary embodiment of the Transmission encoding process 530 including the Interleaver 531 and FEC Hamming Encoder 532. A 64 by 16 bit block is shown. Each of the 16 rows represents a single 64 bit Extended Hamming codeword. At the encoder, data is read into the interleaver block from left to right across the rows starting with codeword 0 bit 0 and ending with codeword 15 bit 63. Bit positions (columns) 0, 1, 2, 4, 8, 16, and 32 are skipped and filled with zero. After filling the Interleaver 531, Hamming encoding is performed by the FEC Encoder 532 on the 57 data bits in each row. The Hamming parity bits are inserted into bit positions 1, 2, 4, 8, 16, and 32 as shown in the diagram. The parity check bit is inserted into bit position 0. The parity bits and parity check bits for all 16 codes can be computed at the same time using a 16 bit wide exclusive OR function. The parity bits Pi are computed as follows:

Pi=XOR Codeword Bit[k] i=0..6
(k−1) & $2^i \neq 0$; where "&" is a bitwise binary AND function After the parity bits are inserted into their bit positions, the Parity Check Bits PC (one bit for each code) are computed as follows:

$$PC = \underset{k=1}{\overset{63}{XOR}} \text{ Codeword Bit}[k]$$

Once the parity bits have been computed and inserted, data is read out of the interleaver from top to bottom down the columns starting at Codeword 0, Bit 0 and ending with Codeword 15, Bit 63.

Figure 6A:
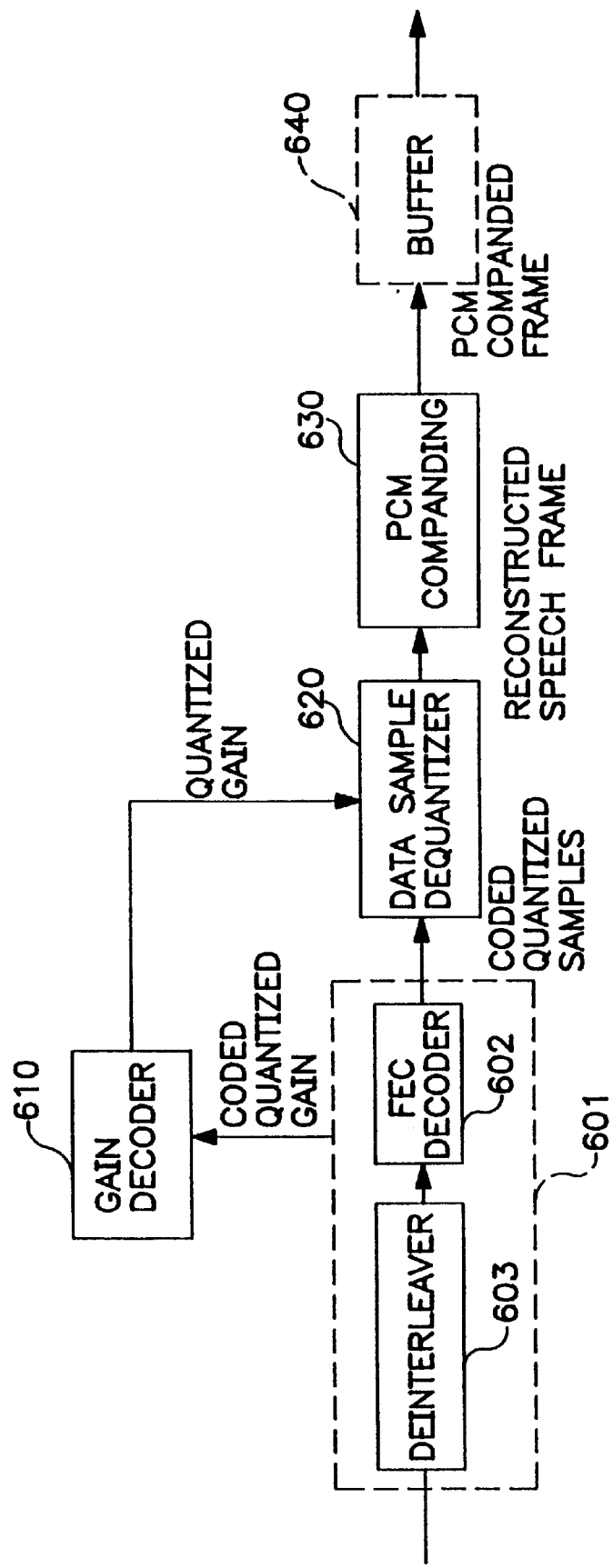
FIG. 6A is a high level block diagram of the High Speed Data Decoder in accordance with an exemplary embodiment of the present invention.

FIG. 6A is a high level block diagram of the High Speed Data Decoder in accordance with an exemplary embodiment of the present invention. The High Speed Data Decoder implements the inverse of the data compression process of the High Speed Data Encoder, and the Decoder includes an optional Transmission Decoding process 601, a Frame Gain Decoder 610, a Data Sample Dequantizer 620, a PCM Compander 630, and a Buffer 640. The Transmission Decoding process 801 includes a Deinterleaver 603 and a FEC Decoder 602.

Figure 6B:
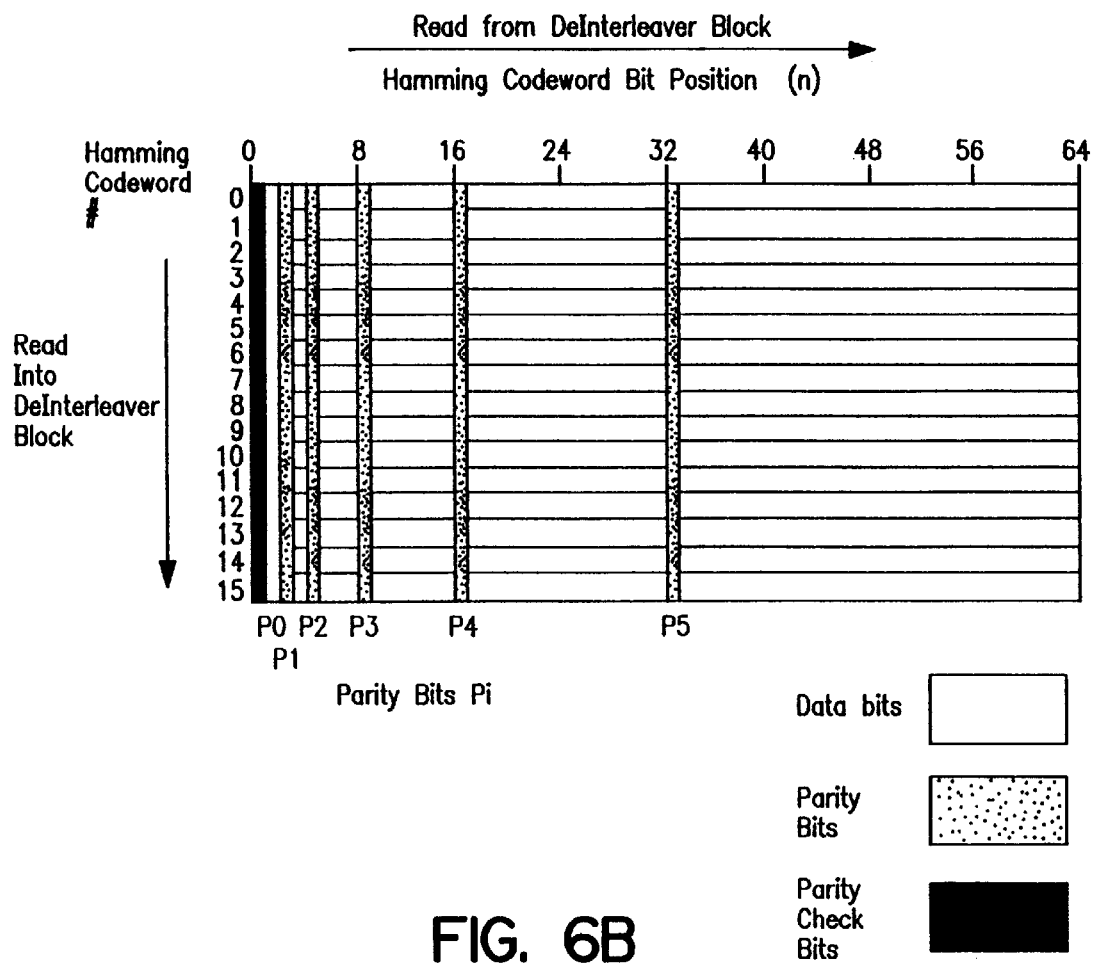
FIG. 6B illustrates a High Speed Data Decoder transmission decoding process in accordance with an exemplary embodiment of the present invention.

The operation of the High Speed Data Decoder is now described with reference to FIG. 6A. The received compressed data is optionally fed into the Deinterleaver 603, which is a 16*64 bit block deinterleaving process. The output of the Deinterleaver 603 is fed into the FEC decoder 602, which is a (64,57) extended Hamming decoder. The Hamming decoder can correct 1 bit error and detect 2 bit errors per block. FIG. 6B shows the deinterleaver and Hamming decoding process of one embodiment of the present invention. Data is read into the Deinterleaver 603 from top to bottom starting with codeword 0 bit 1 and ending with codeword 15 bit 63. The syndrome is computed as follows:

Compute Parity Bits:
Pi=XOR Codeword Bit[k] i=0..5
(k−1) & $2^i \neq 0$; where "&" is a bitwise binary AND function
Syndrome=concatenation P5|P4|P3|P1|P0

The Parity Check Bits (one bit for each code) are computed as follows:

$$PC = \underset{k=1}{\overset{63}{XOR}} \text{ Codeword Bit}[k]$$

The numerical representation of the syndrome indicates the bit position (if any) where a bit error has occurred. When a bit error has occurred, the bit is inverted (corrected) if the parity check bit for that code is set. Otherwise, it is assumed that there are 2 (or more) bit errors in the code and the syndrome is incorrect. If the syndrome is zero, no bit error has occurred. As in the encoder case, the parity bits and the parity check bits for all 16 codewords can be computed at the same time using a 16 bit wide exclusive OR operation.

Returning to FIG. 6A, the decoded data from the FEC Decoder 602 consists of the Encoded Quantized Samples and Encoded Quantized Gain. The Encoded Quantized Gain is provided to the Gain Decoder 610 which reads the Quantized Gain value from a table using the Encoded Quantized Gain as the index into the table. As mentioned previously, the Encoded Quantized Gain represents a level value of a 64 level logarithmically spaced quantizer.

The Quantized Gain value is provided to the Data Sample Dequantizer 620, where it is used to scale the level values of a 32 level uniform quantizer level table. The scaled quantizer table decodes the Encoded Quantized Samples into a block of Linear Quantized Samples.

The block of Linear Quantized Samples are converted to a block of PCM samples (A law or Mu law) by the PCM Companding Process 630. The block of PCM samples is then optionally provided to the Buffer 640 which provides the PCM samples as an output 64 kb/s signal.

The Ultra High Speed CODEC

Figure 7A:
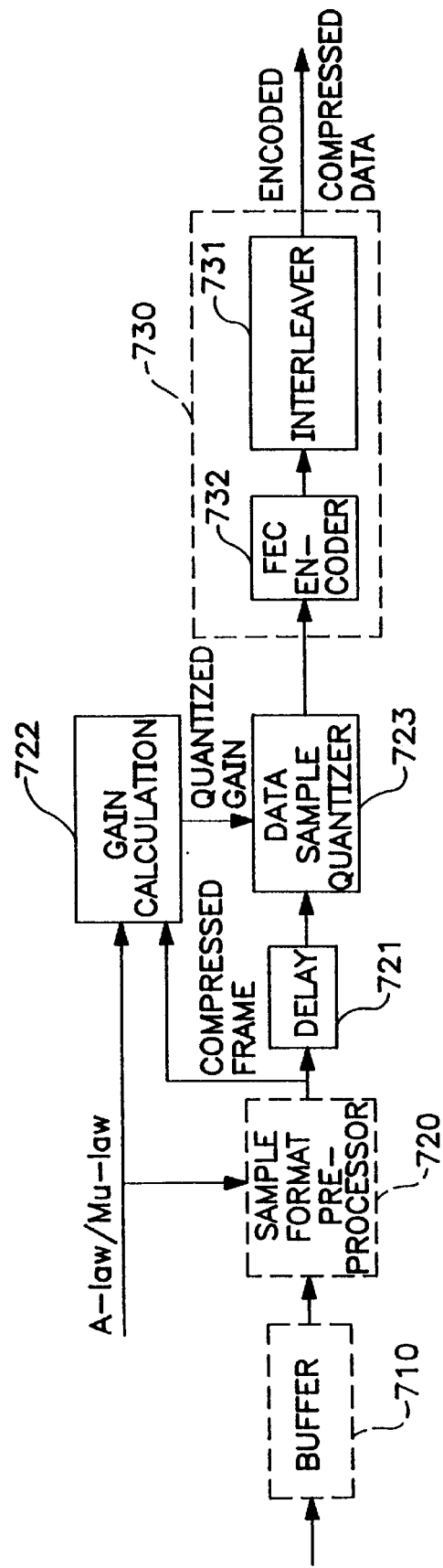
FIG. 7A is a high level block diagram of the Ultra High Speed Data Encoder in accordance with an exemplary embodiment of the present invention.

FIG. 7A is a high level block diagram of the Ultra-High Speed Data Encoder. The Ultra-High Speed Data Coder performs data compression and expansion of the ultra high speed voiceband modem signals. The Coder transforms data between 64 kb/s PCM and a 62.58 kb/s FEC Encoded compressed data stream. The actual compressed data rate is 56.311 kb/s, and the remaining bit stream is used for error correction data. The Ultra-High Speed Codec is similar to the High Speed Codec.

As shown in FIG. 7A, the Ultra High Speed Data Encoder of the present invention includes an optional Buffer 710, an optional Sample Format Pre-processor 720, a Gain Calculation process 722, a Delay 721, a Data Sample Quantizer 723, and an optional Transmission Encoding process 730. The Transmission encoding process 730 further includes a FEC encoder 732 and an interleaver 731.

The optional Buffer 710 holds a predetermined number of samples to create a block of samples for the Ultra High Speed Data compression process. The Sample Format Pre-processor 710 removes the A-law, or other standard transmission formatting of the PCM samples and also converts the sample values to a predetermined numerical format, such as their decimal equivalents, for convenience in subsequent processing. The Gain Calculation process 722 calculates the Quantized Gain value for the block of samples, and the Data Sample Quantizer uses the Quantized Gain value to create a set of quantizer levels with predetermined spacing and with quantization level values scaled by the Quantized Gain value. The delay shows that the Quantized gain value is determined before the compression process creates Encoded Quantized Samples, and the Transmission Encoding Process 730 is used to provide error correction coding for transmission of the encoded Quantized Gain and Encoded Quantized Samples.

The operation of the Ultra-High Speed Data compression process is now described. The 64 kb/s PCM samples (A-law or Mu-law) are provided to the Buffer 710. The Buffer 710 provides the PCM samples as 22.5 millisecond blocks of samples. At the 8 Kilosample/second rate of the PCM, each block contains 180 samples.

Unlike the High Speed Codec, the Ultra-High Speed codec does not convert the PCM samples to linear samples. Instead, the 8 bit PCM data is converted to a predetermined type of format for sample representation. In the exemplary embodiment, for Mu-law, no operation is required to convert to the format, but for A-law, the Sample Format Pre-processor 720 converts the samples to predetermined level value format before the subsequent quantizer processing. As apparent to one skilled in the art, the Mu-law samples could be converted to A-law representation, or in another exemplary embodiment, both formats could be converted to a third predetermined format.

In the Ultra-High Speed Codec it is desirable that the PCM compression type be the same at both the transmit and receive ends of the link. Otherwise, without further processing, the differences between the Mu-law and A-law characteristics may cause non-linearity in the end-to-end characteristics of the compression coding.

The received sample block in the predetermined sample format is provided to the Gain Calculation process 722, which finds the sample in the block with the largest amplitude value (absolute value). The amplitude of this sample determines the Quantized Gain for the block. The Quantized Gain requires 7 bits since the sign bit of the amplitude is not used.

Table 5 shows how numbers are represented in A-law and Mu-law standards. The absolute value of the sample corresponding to these respective representations is determined and the maximum amplitude calculated.

TABLE 5

| Dec number | aLaw Equiv | aLaw Hex | uLaw Equiv | uLaw Hex |
|---|---|---|---|---|
| 127 | 255 | FF | 128 | 80 |
| 112 | 240 | F0 | 143 | 8F |
| 96 | 224 | E0 | 159 | 9F |

TABLE 5-continued

| Dec number | aLaw Equiv | aLaw Hex | uLaw Equiv | uLaw Hex |
|---|---|---|---|---|
| 16 | 144 | 90 | 239 | EF |
| 2 | 130 | 82 | 253 | FD |
| 1 | 129 | 81 | 254 | FE |
| 0 | 128 | 80 | 255 | FF |
| −1 | 1 | 01 | 126 | 7E |
| −2 | 2 | 02 | 125 | 7D |
| −16 | 16 | 10 | 111 | 6F |
| −96 | 96 | 60 | 31 | 1F |
| −112 | 112 | 70 | 15 | 0F |
| −127 | 127 | 7F | 0 | 00 |

The Quantized Gain from the Gain Computation Process 722 and the 2's complement block are provided to the Data Sample Quantizer 723 after the Quantized Gain value is calculated, as shown by the presence of the delay 721.

The Data Sample Quantizer 723 creates a new quantizer with a set of quantizer levels from the A-law or Mu-law block of samples. The following discussion describes how the new quantizer is determined for a block of samples. The Mu-law quantizer divides the range of input amplitudes into 7 segments, and the Mu-law quantizer divides the range of input amplitudes into 8 segments. For convenience, the following discussion describes the A-law process with 7 segments, but it is obvious to one skilled in the art to extend the A-law discussion to compression of Mu-law samples.

Each segment (except the first) has a range of amplitudes that is half that of the next one, and each segment (except the first) has 16 quantization levels values. As a result, the quantizer step size in each segment is twice that of the previous one. Table 6 lists the A-law quantizer segments along with their amplitude ranges and step sizes of one exemplary embodiment.

TABLE 6

| Segment Number | Input Amplitude Range | Normalized Amplitude Range | Normalized Step Size | A-Law Code |
|---|---|---|---|---|
| 1 | 0 ... 31 | 0 ... 1/64 | 1/2048 | 0 ... 31 |
| 2 | 32 ... 63 | 1/64 ... 1/32 | 1/1024 | 32 ... 47 |
| 3 | 64 ... 127 | 1/32 ... 1/16 | 1/512 | 48 ... 63 |
| 4 | 128 ... 255 | 1/16 ... 1/8 | 1/256 | 64 ... 79 |
| 5 | 256 ... 511 | 1/8 ... 1/4 | 1/128 | 80 ... 95 |
| 6 | 512 ... 1023 | 1/4 ... 1/2 | 1/64 | 96 ... 111 |
| 7 | 1023 ... 2047 | 1/2 ... 1 | 1/32 | 112 ... 127 |

The samples representing the input data signal can span the entire dynamic range of the A-law quantizer, and the A-law quantizer is converted to a new quantizer by eliminating selected ones of the A-law quantizer levels. The following illustrates the process if the resulting new quantizer has uniform level value spacing and all segments are used for representing a block of samples. The step size of the last segment, 1/32, is the largest step size in the quantizer, therefore, all quantizer level values in the last segment are retained. The sixth segment has a quantizer level value step size of 1/64. A 1/32 step size in the seventh segment determines that every other quantizer level in the sixth segment is eliminated, resulting in a step size of 1/32. Similarly, this process is repeated for the fifth to third segments. The second and first segments combined only span a range of 1/32, and therefore none of the quantizer levels are retained. This results in 31 positive levels and 31 negative levels, and a zero level is retained to separate the first positive segment and the first negative segment, giving a 63 level uniform quantizer.

Next, the process computes the peak amplitude of a block of samples and determines which A-law segment contains that amplitude. For that block of data, all segments higher than this "Peak Segment" are ignored. The step size of the Peak Segment defines the uniform quantizer's step size. Therefore, in the resulting uniform quantizer for the block, all quantizer levels in the Peak Segment are retained, half the levels in the next lower segment are retained, and quantizer level values are assigned until either the last segment is reached or no further quantizer level values are available.

Figure 9:
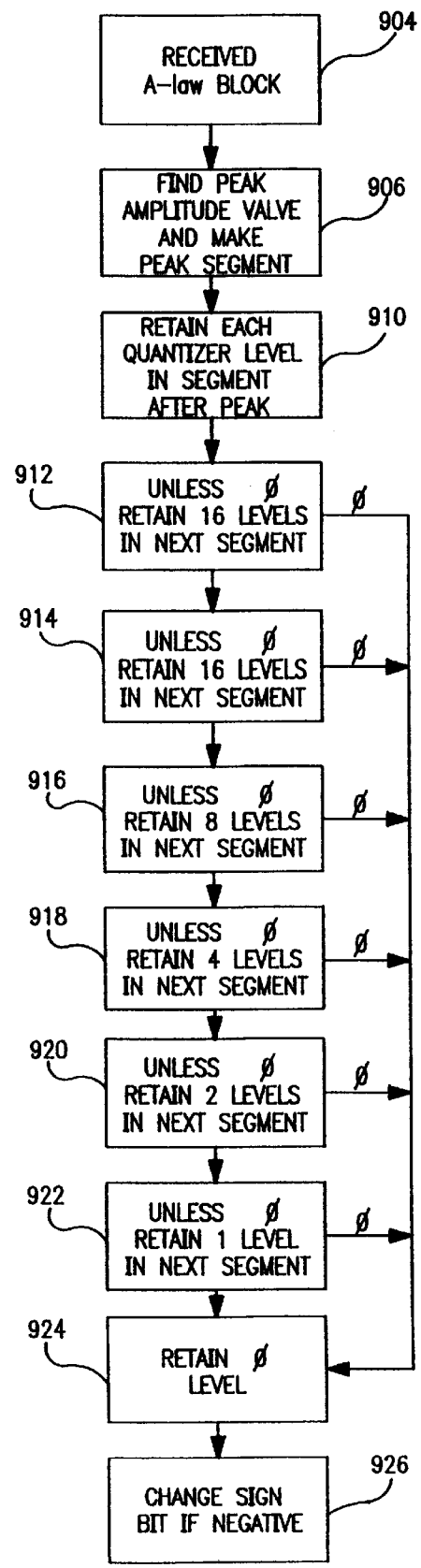
FIG. 9 is a high level flowchart illustrating an Ultra High Speed quantizing algorithm used to map the PCM quantized samples into compressed quantized samples in accordance with an exemplary embodiment of the present invention.

The method of operation of Ultra High Speed quantizer, a 128 level quantizer, of an exemplary embodiment of the present invention is shown in FIG. 9.

At step 904, the method receives a block of companded samples (such as A-law or Mu-law companding).

At step 906, the peak amplitude sample in the block and the corresponding segment is determined, and the peak amplitude value is the peak segment.

At step 910, retain every quantizer level value of the peak segment.

At step 912, unless the zero level has been reached, retain all 16 levels of the next segment.

At step 914, unless the zero level is reached, retain all 16 levels in the next segment.

At step 916, unless the zero level is reached, retain every other level value (8 level values) in the next segment.

At step 918, unless the zero level is reached, retain four levels in the next lowest segment.

At step 920, unless the zero level is reached, retain 2 levels of the next lowest segment.

At step 922, unless the zero level is found, retain 1 level of the next lowest segment.

At step 924, retain the zero level.

Finally, at step 926, create the negative levels using equal magnitudes as the positive levels, but opposite sign, by setting a sign value.

The peak amplitude (7 bits) and 180 7-bit coded samples comprise the compressed output from the Ultra-High Speed Encoder's compression process.

Returning to FIG. 7A, the Encoded Quantized Gain and Encoded Quantized Samples are provided to the Transmission Encoding process 730. The exemplary embodiment of the Transmission encoding process 730 includes the FEC Encoder 732, which is, for example, a (87,80) Hamming encoder. The Hamming code is capable of correcting a single bit error in the 87 bit block. The FEC Encoder provides the forward error correction encoded uniformly quantized and compressed data samples into the Interleaver 731, which is, for example, a 16*87 bit block interleaver. The Interleaver 731 provides Encoded Compressed Data for modulation on the RF communication channel.

Figure 7B:
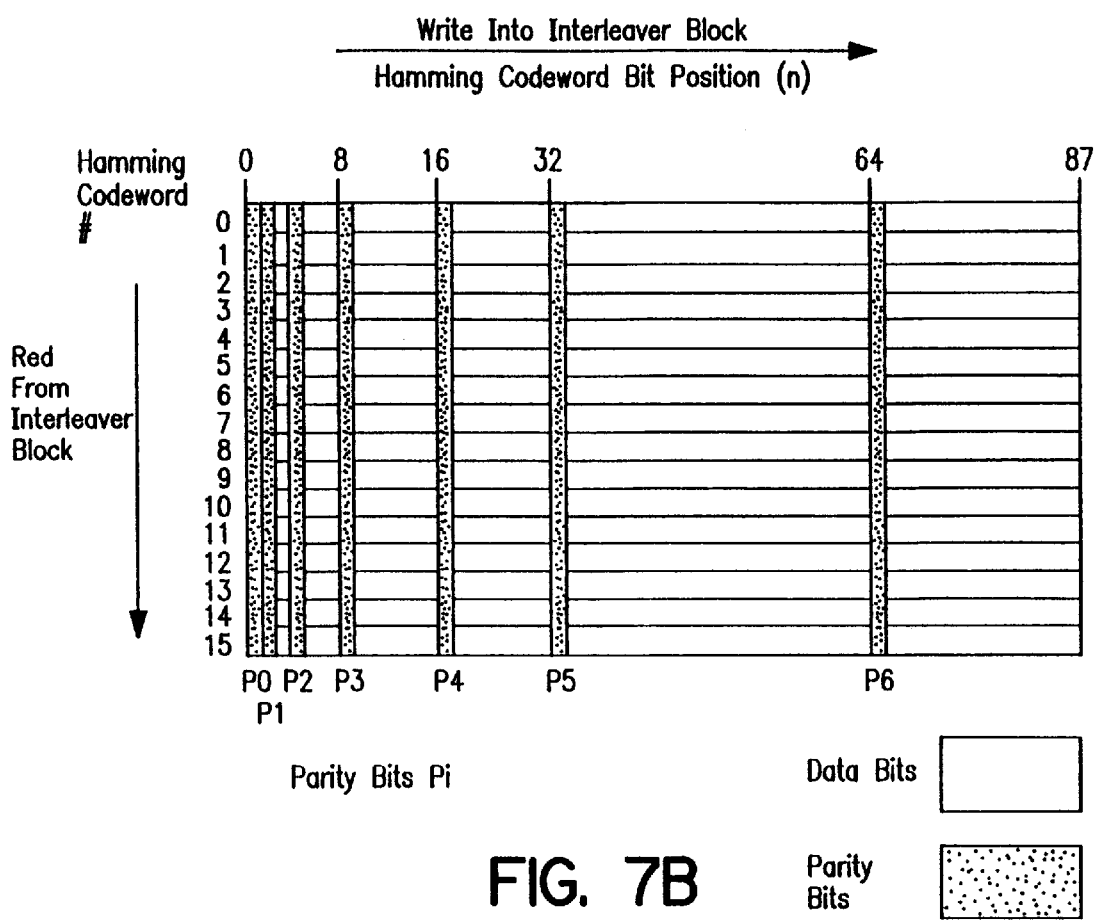
FIG. 7B illustrates a Ultra High Speed Data Encoder transmission encoding process in accordance with an exemplary embodiment of the present invention.

FIG. 7B is a block diagram of the Transmission Encoding process of the exemplary embodiment of the Ultra High Speed Data Encoder. An 87 by 16 bit block is shown. Each of the 16 rows represents a single 87 bit Hamming codeword. At the encoder, data is read into the interleaver block from left to right across the rows starting with codeword 0 bit 1 and ending with codeword 15 bit 86. Bit positions (columns) 1, 2, 4, 8, 16, 32 and 64 are skipped and filled with zero. The last column/word of the interleaver block receives special treatment. It only contains data in its first 3 rows/bit positions. The remaining rows/bit positions are zero filled.

After filling the interleaver, Hamming encoding is performed on the 80 data bits in each row. The Hamming parity bits are inserted into bit positions 1, 2, 4, 8, 16, 32 and 64 as shown in the diagram. The parity bits for 6 codes can be computed at the same time using a 16 bit wide exclusive OR function of the DSP. The parity bits Pi are computed as follows, and shown in Table 7:

Pi=XOR Codeword Bit[k] i=0..6
  (k−1) & $2^i \neq 0$; where "&" is a bitwise binary AND function

TABLE 7

| Parity Bit | XOR Set |
|---|---|
| P0 | 1, 3, 5, 7, . . . , 85, 87 |
| P1 | 2–3, 6–7, . . . , 86–87 |
| P2 | 4–7, . . . , 84–87 |
| P3 | 8–15, 24–31, 40–47, 56–63, 72–79 |
| P4 | 16–31, 48–63 |
| P5 | 32–63 |
| P6 | 64–87 |

Once the parity bits have been computed and inserted, data is read out of the interleaver from top to bottom down the columns starting at Codeword 0, Bit 1 and ending with Codeword 15, Bit 87.

Table 8 shows the interleaver block. There are 88 words numbered 0 to 87. The first word is unused but maintained for similarity to HSD. The first word is not transmitted. The numbers 0 to 1266 represent the 1267 bits from the 181 words. "P" of Table 8 stands for parity.

TABLE 8

| Word/Bit | 15 | 14 | 13 | . . . | 2 | 1 | 0 |
|---|---|---|---|---|---|---|---|
| 0 | U | U | U | . . . | U | U | U |
| 1 | P0 | P0 | P0 | | P0 | P0 | P0 |
| 2 | P1 | P1 | P1 | | P1 | P1 | P1 |
| 3 | 1188 | 1109 | 1030 | | 160 | 80 | 0 |
| 4 | P2 | P2 | P2 | | P2 | P2 | P2 |
| 5 | 1189 | 1110 | 1031 | | 161 | 81 | 1 |
| 6 | 1190 | 1111 | 1032 | | 162 | 82 | 2 |
| 7 | 1191 | 1112 | 1033 | | 163 | 83 | 3 |
| 8 | P3 | P3 | P3 | | P3 | P3 | P3 |
| 9 | 1192 | 1113 | 1034 | | 164 | 84 | 4 |
| 10 | 1193 | 1114 | 1035 | | 165 | 85 | 5 |
| 11 | 1194 | 1115 | 1036 | | 166 | 86 | 6 |
| 12 | 1195 | 1116 | 1037 | | 167 | 87 | 7 |
| 13 | 1196 | 1117 | 1038 | | 168 | 88 | 8 |
| 14 | 1197 | 1118 | 1039 | | 169 | 89 | 9 |
| 15 | 1198 | 1119 | 1040 | | 170 | 90 | 10 |
| 16 | P4 | P4 | P4 | | P4 | P4 | P4 |
| 17 | 1199 | 1120 | 1041 | | 171 | 91 | 11 |
| 18 | 1200 | 1121 | 1042 | | 172 | 92 | 12 |
| . | . | . | | | | | |
| 31 | 1213 | 1134 | 1055 | | 185 | 105 | 25 |
| 32 | P5 | P5 | P5 | | P5 | P5 | P5 |
| 33 | 1214 | 1135 | 1056 | | 186 | 106 | 26 |
| . | . | . | | | | | |
| 62 | 1243 | 1164 | 1085 | | 215 | 135 | 55 |
| 63 | 1244 | 1165 | 1086 | | 216 | 136 | 56 |
| 64 | P6 | P6 | P6 | | P6 | P6 | P6 |
| 65 | 1245 | 1166 | 1087 | | 217 | 137 | 57 |
| . | . | . | | | | | |
| 86 | 1266 | 1187 | 1108 | | 238 | 158 | 78 |
| 87 | 0 | 0 | 0 | | 239 | 159 | 79 |

Figure 8A:
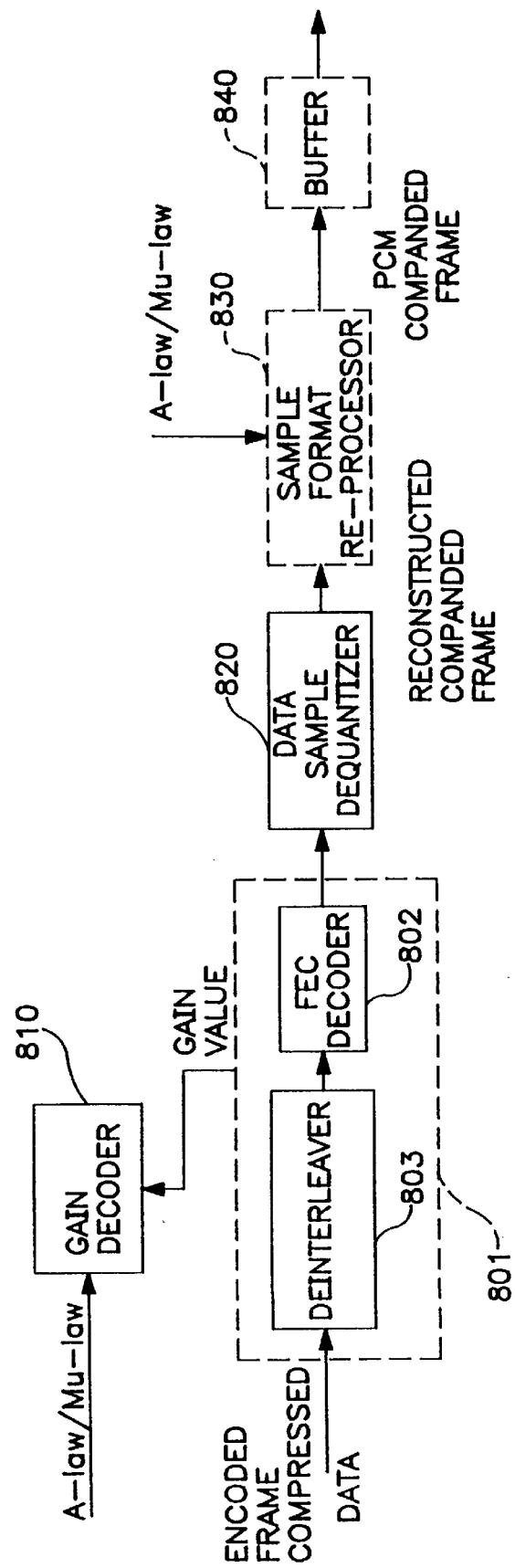
FIG. 8A is a high level block diagram of the Ultra High Speed Data Decoder in accordance with an exemplary embodiment of the present invention.

FIG. 8A is a block diagram of the Ultra High Speed Data Decoder of the present invention. The data expansion process is the inverse of the data compression process, and the Decoder includes an optional Transmission Decoding process 801, a Gain Decoder 810, a Data Sample Dequantizer 820, an optional Sample Format Re-Processor 830, and an optional Buffer 840. The optional Transmission Decoding process 801 includes a Deinterleaver 803 and a FEC Decoder 802.

As shown in FIG. 8A, the received Encoded Compressed Data is provided to the Transmission Decoding process 801 to remove transmission encoding and correct for transmission errors. The Transmission Decoding process 801 of the exemplary embodiment of the present invention includes the Deinterleaver 803, which is a 16*87 bit block deinterleaver. The output of the Deinterleaver 803 is provided to the FEC Decoder 802, which is a (87,80) Hamming decoder. The Hamming decoder can correct 1 bit error per block.

Figure 8B:
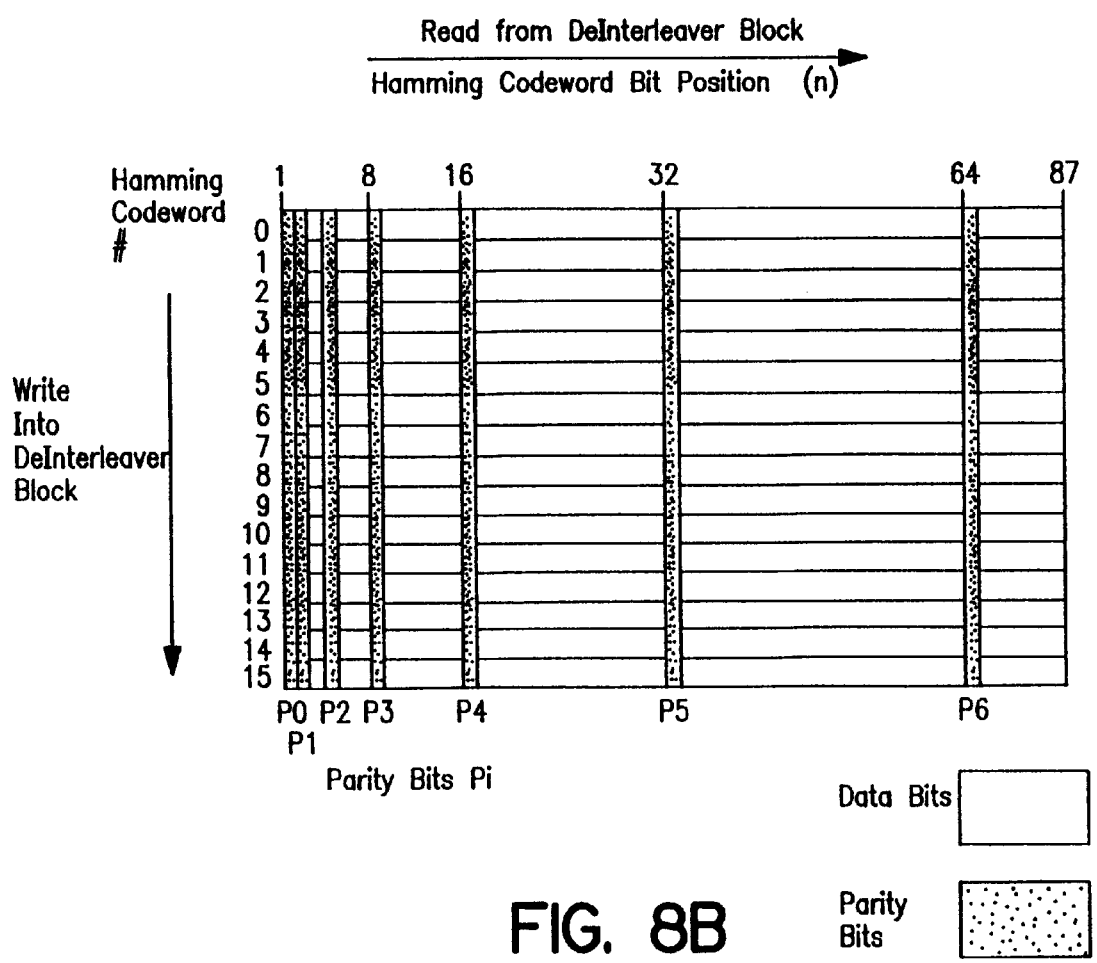
FIG. 8B illustrates an Ultra High Speed Data Decoder transmission decoding process in accordance with an exemplary embodiment of the present invention.

FIG. 8B shows an embodiment of the Transmission Decoding process of the Ultra High Speed Data Decoder of an embodiment of the present invention, including the deinterleaving and Hamming Decoding. Encoded Compressed Data is read into the Deinterleaver from top to bottom starting with codeword 0 bit 1 and ending with codeword 15 bit 86. Special treatment is required for the last column/word.

The numerical representation of the syndrome indicates the bit position (if any) where a bit error has occurred. When a bit error has occurred, the bit is inverted (corrected.) If the syndrome is zero, no bit error has occurred. As in the Ultra High Speed Data Encoder, the parity bits for up to 16 codewords can be computed at the same time using a 16 bit wide exclusive OR operation.

The syndrome is computed as follows:
Compute Parity Bits:
Pi=XOR Codeword Bit[k] i=0..6
 (k–1) & $2^i \neq 0$; where "&" is a bitwise binary AND function
Syndrome=concatenation P6|P5|P4|P3|P2|P1|P0

The decoded data from the FEC Decoder 801 consists of Encoded Quantized Samples and Encoded Quantized Gain. The Encoded Gain is fed into the Gain Decoder, which provides the Quantized Gain value to the Data Sample Dequantizer 820.

The Data Sample Quantizer generates a lookup table containing the A-law (or Mu-law) quantizer levels corresponding to the 7 bit coded samples using the Quantized Gain value (the peak amplitude sample of the block). The quantizer is created using exactly the same procedure as is described in the Ultra High Speed Data Encoder section, in which the lookup table has 256 entries, with each of the entries corresponding to one of the 128 possible encoded quantized sample values. However, the lookup table is used in the opposite way. Once the lookup table is generated with 128 entries of the possible encoded quantized sample values, the corresponding PCM samples are found in the table by indexing the corresponding Encoded Quantized Samples (7 bit codes) to the table entry.

As shown in FIG. 8A, if A-law companding is desired, an optional Sample Format Re-Processor 830 transforms the decoded block of samples into a desired sample format, such as A-law. For either A-law or Mu-law, the decoded block of samples corresponding to the reconstructed ultra high speed data samples is provided to the output Buffer 840, which provides a 64 kb/s PCM companded signal as an output signal.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed:

1. A telecommunications apparatus for receiving a plurality of telephone signals and for transmitting each of the telephone signals on a respective communication channel, wherein each communication channel is formed on at least one transmit radio frequency (RF) carrier, each RF carrier having a plurality of information slots and at least one of the information slots is assigned to one of the telephone signals so that the one of the telephone signals is modulated on the RF carrier; the apparatus comprising:

detector means for receiving and for monitoring each of the telephone signals to detect a data signal in one of the telephone signals:

encoding means for encoding the data signal to generate a coded signal;

control means for checking an assignment status of ones of the information slots responsive to detection of the data signal and for locating a predetermined number of unassigned sequential information slots for a predetermined bandwidth, the assignment status indicating whether each information slot is unassigned or assigned to a respective one of the telephone signals;

channel forming means for forming the communication channel from the unassigned sequential information slots; and means for modulating the coded signal on the communication channel; whereby the telecommunications system also receives at least one reconstructed telephone signal having a response data signal from a received RF carrier, each reconstructed telephone signal and each respective telephone signal being a channel pair;

the data signal has a corresponding data signal identification of a first type, and the response data signal has a corresponding data signal identification of a second type; and the detector means inhibits the data signal identification of the first type until the communication channel is formed.

2. The telecommunications apparatus as recited in claim 1, wherein the detector means receives and inhibits the data signal identification of the second type until the communication channel is formed.

3. The telecommunications apparatus as recited in claim 2, wherein the data signal and the response data signals are of a facsimile type, and the data signal identification of the first type is a 2100 Hz tone and the data signal identification of the second type is an 1800 Hz tone.

4. In a telecommunications system, a method of receiving a plurality of telephone signals and for transmitting each of the telephone signals on a respective communication channel, wherein each communication channel is formed on at least one transmit radio frequency (RF) carrier, each RF carrier having a plurality of information slots and at least one of the information slots is assigned to one of the telephone signals so that the one of the telephone signals is modulated on the RF carrier; the method comprising the steps of:

a) receiving and monitoring each of the telephone signals to detect a data signal in one of the telephone signals, wherein at least one of said telephone signals is a reconstructed telephone signal having a response data signal from a received RF carrier, each reconstructed telephone signal and each respective telephone signal being a channel pair; the data signal has a corresponding data signal identification of a first type, and the response data signal has a corresponding data signal identification of a second type;

b) encoding the data signal to generate a coded signal;

c) checking an assignment status of ones of the information slots responsive to detection of the data signal, the assignment status indicating whether each carrier and each information slot is unassigned or assigned to another one of the telephone signals;

d) locating a predetermined number of unassigned sequential information slots;

e) forming the communication channel from the unassigned sequential information slots; and f) modulating the coded signal on the communication channel; whereby the receiving and monitoring step a) further includes inhibiting the data signal identification of the first type until the forming step e) forms the communication channel.

5. The telecommunications method as recited in claim 4, wherein the step of inhibiting the data signal identification of the first type further includes inhibiting the data signal identification of the second type until the forming step e) forms the communication channel.

6. The telecommunications method as recited in claim 5, wherein the data signal and the response data signals are of a facsimile type, and the data signal identification of the first type is a 2100 Hz tone and the data signal identification of the second type is an 1800 Hz tone.

* * * * *